(12) United States Patent
Weiner et al.

(10) Patent No.: US 9,960,312 B2
(45) Date of Patent: May 1, 2018

(54) APPARATUS AND METHODS FOR FAST CHEMICAL ELECTRODEPOSITION FOR FABRICATION OF SOLAR CELLS

(76) Inventors: Kurt H. Weiner, San Jose, CA (US); Gaurav Verma, Sunnyvale, CA (US)

( * ) Notice: Subject to any disclaimer, the term of this patent is extended or adjusted under 35 U.S.C. 154(b) by 0 days. days.

(21) Appl. No.: 13/081,389

(22) Filed: Apr. 6, 2011

(65) Prior Publication Data

US 2011/0290641 A1 Dec. 1, 2011

Related U.S. Application Data

(63) Continuation-in-part of application No. 12/787,330, filed on May 25, 2010.

(51) Int. Cl.
| | | |
|---|---|---|
| H01L 31/18 | (2006.01) |
| C25D 17/00 | (2006.01) |
| C25D 17/06 | (2006.01) |
| H01L 31/0224 | (2006.01) |
| C25D 5/02 | (2006.01) |
| C25D 5/54 | (2006.01) |
| C25D 21/12 | (2006.01) |

(52) U.S. Cl.
CPC ............ *H01L 31/18* (2013.01); *C25D 5/022* (2013.01); *C25D 5/54* (2013.01); *C25D 17/001* (2013.01); *C25D 17/005* (2013.01); *C25D 17/06* (2013.01); *H01L 31/022425* (2013.01); *C25D 21/12* (2013.01); *Y02E 10/50* (2013.01)

(58) Field of Classification Search
USPC ..................................... 204/280, 286.1, 289
See application file for complete search history.

(56) References Cited

U.S. PATENT DOCUMENTS

| | | | |
|---|---|---|---|
| 3,073,011 A | 1/1963 | Boyd et al. |
| 3,949,463 A | 4/1976 | Lindmayer |
| 4,478,689 A * | 10/1984 | Loch ................ C25D 11/04 |
| | | | 204/229.3 |
| 4,507,181 A | 3/1985 | Nath |
| 4,595,791 A | 6/1986 | Basol |
| H274 H | 5/1987 | Ruggerio |
| 4,816,120 A | 3/1989 | Ondris |

(Continued)

FOREIGN PATENT DOCUMENTS

| | | |
|---|---|---|
| CN | 1551931 A | 12/2004 |
| JP | 62274094 A | 11/1987 |

(Continued)

OTHER PUBLICATIONS

International Search Report for PCT/US2011/036339 dated Dec. 20, 2011.

(Continued)

*Primary Examiner* — Stefanie S Wittenberg
(74) *Attorney, Agent, or Firm* — Kwan & Olynick LLP

(57) ABSTRACT

The invention relates generally to electrodeposition apparatus and methods. When depositing films via electrodeposition, where the substrate has an inherent resistivity, for example, sheet resistance in a thin film, methods and apparatus of the invention are used to electrodeposit materials onto the substrate by forming a plurality of ohmic contacts to the substrate surface and thereby overcome the inherent resistance and electrodeposit uniform films. Methods and apparatus of the invention find particular use in solar cell fabrication.

42 Claims, 16 Drawing Sheets

(56) References Cited

U.S. PATENT DOCUMENTS

| | | | |
|---|---|---|---|
| 4,872,925 A | 10/1989 | McMaster | |
| 5,055,169 A * | 10/1991 | Hock et al. | 427/531 |
| 5,516,412 A | 5/1996 | Andricacos et al. | |
| 5,985,123 A | 11/1999 | Koon | |
| 6,071,388 A | 6/2000 | Uzoh | |
| 6,072,190 A | 6/2000 | Watanabe | |
| 6,074,544 A | 6/2000 | Reid et al. | |
| 6,106,680 A * | 8/2000 | Nogami et al. | 204/280 |
| 6,132,587 A | 10/2000 | Jorné et al. | |
| 6,136,163 A | 10/2000 | Cheung et al. | |
| 6,156,167 A | 12/2000 | Patton et al. | |
| 6,159,354 A | 12/2000 | Contolini et al. | |
| 6,162,344 A | 12/2000 | Reid et al. | |
| 6,176,992 B1 | 1/2001 | Talieh | |
| 6,217,734 B1 | 4/2001 | Uzoh | |
| 6,297,657 B1 * | 10/2001 | Thiessen et al. | 324/754.13 |
| 6,482,307 B2 | 11/2002 | Ashjaee et al. | |
| 6,517,689 B1 | 2/2003 | Hongo et al. | |
| 6,761,812 B2 * | 7/2004 | Preusse et al. | 205/81 |
| 6,793,796 B2 | 9/2004 | Reid | |
| 6,805,778 B1 * | 10/2004 | Batz et al. | 204/297.1 |
| 6,860,769 B2 | 3/2005 | Liu | |
| 7,666,008 B2 | 2/2010 | Levante et al. | |
| 7,704,352 B2 | 4/2010 | Lopatin et al. | |
| 8,343,327 B2 | 1/2013 | Weiner | |
| 2001/0035354 A1 * | 11/2001 | Ashjaee | C25F 7/00 205/103 |
| 2003/0089598 A1 | 5/2003 | Basol et al. | |
| 2003/0132102 A1 | 7/2003 | Liu et al. | |
| 2004/0000485 A1 | 1/2004 | Preusse et al. | |
| 2004/0055893 A1 | 3/2004 | Lubornirsky | |
| 2004/0137800 A1 | 7/2004 | Jing | |
| 2004/0149586 A1 * | 8/2004 | Sul | A61L 27/06 205/171 |
| 2004/0231994 A1 | 11/2004 | Basol et al. | |
| 2007/0056856 A1 | 3/2007 | Hong | |
| 2010/0122908 A1 | 5/2010 | Takeguchi | |

FOREIGN PATENT DOCUMENTS

| | | |
|---|---|---|
| JP | 05-004213 | 1/1993 |
| JP | 2006144060 A | 6/2006 |
| TW | 504796 B | 10/2002 |
| TW | I532884 | 5/2016 |
| WO | WO 2011/054037 | 5/2011 |

OTHER PUBLICATIONS

International Written Opinion for PCT/US2011/036339 dated Dec. 20, 2011.
"Chinese Application Serial No. 201180032000.4, Office Action dated Dec. 31, 2014", 26 pgs.
"Taiwan Application Serial No. 100118191, Office Action dated Apr. 27, 2015", 26 pgs.
"U.S. Appl. No. 12/787,330, Notice of Allowance dated Nov. 19, 2012", 9 pgs.
"U.S. Appl. No. 12/787,330, Preliminary Amendment filed Mar. 6, 2012", 6 pgs.
"U.S. Appl. No. 12/787,330, Non-Final Office Action dated Jul. 10, 2012", 21 pgs.
"U.S. Appl. No. 12/787,330, Final Office Action dated Aug. 28, 2012", 14 pgs.
"European Application Serial No. 11787115.2, Partial Supplementary Search Report dated Dec. 16, 2016", 8 pgs.
"Taiwanese Application Serial No. 100118191, Notice of Allowance dated Jan. 4, 2016", 13 pgs.
, "European Application Serial No. 11787115.2, Search Report dated May 3, 2017", 14 pgs.
, "Korean Application Serial No. 10-2012-7033611, Office Action dated Jan. 16, 2017", 39 pgs.
"Korean Application Serial No. 10-2012-7033611, Final Office Action dated Sep. 29, 2017", 9 pgs.

* cited by examiner

APPARATUS AND METHODS FOR FAST CHEMICAL ELECTRODEPOSITION FOR FABRICATION OF SOLAR CELLS

CROSS REFERENCE TO RELATED APPLICATIONS

This application is a continuation-in-part of, and claims the benefit of priority to, U.S. patent application Ser. No. 12/787,330, filed May 25, 2010 and titled "APPARATUS AND METHODS FOR FAST CHEMICAL ELECTRODEPOSITION FOR FABRICATION OF SOLAR CELLS," all of which is incorporated herein by reference in its entirety.

FIELD OF INVENTION

The invention relates generally to electrodeposition apparatus and methods. Methods and apparatus described herein find particular use in solar cell fabrication.

BACKGROUND

Electrodeposition is generally a plating process that uses electrical current to reduce or oxidize chemical species of a desired material from a solution and coat a conductive substrate with a thin layer of that material. An electroplating system typically includes two electrodes and an electrolyte. Additionally, a reference electrode may also sometimes be employed. In an electrodeposition process, typically the part to be coated is one of the electrodes and the coating material is supplied from the electrolyte in which the electrodes are immersed. In electroplating, the electrolyte is replenished periodically with the chemical species being deposited on the substrate. The electrode that is not being coated can be a source of the chemical species in order to replenish the electrolytic solution, or an inert electrode can be used.

Solar or photovoltaic cells are devices that convert photons into electricity by the photovoltaic effect. Solar cells are assembled together to make solar panels, solar modules, or photovoltaic arrays. Thin film solar cells are stacked structures, having layers of materials, including photovoltaic materials, stacked on a substrate for support of the stack. There are many fabrication techniques used for fabricating the individual layers of the stack. One particularly useful method is electrodeposition, however there are drawbacks to conventional apparatus and methods in this respect. For example, when electrodepositing a material onto an electrically insulating substrate, such as glass, a conductive coating must be applied to the substrate in order to allow electric current to pass through the conductive coating. These conductive coatings are typically thin and can have high sheet resistance which produces voltage non-uniformities when electroplating over large areas. In these scenarios uniform deposition of the electroplated film across large area resistive substrates is problematic.

What is needed, therefore, are improved apparatus and methods for electrodeposition on large area resistive substrates. Given the demand for renewable energy, improved apparatus and methods are particularly important for solar cell fabrication where the typical substrate is glass coated by a thin layer of transparent conductive oxide.

SUMMARY

The invention relates generally to electrodeposition apparatus and methods. The inventors have found that when depositing films via electrodeposition, where the substrate has an inherent resistivity, for example, sheet resistance in a thin film, methods and apparatus described herein can be used to electrodeposit materials onto the substrate by forming a plurality of ohmic contacts to a resistive substrate layer, for example a transparent conductive oxide, and thereby overcome the resistance intrinsic to the substrate layer to electrodeposit uniform films thereon. Methods and apparatus described herein find particular use in solar cell fabrication.

One embodiment is an apparatus for electrodeposition, including: (i) a counter electrode including a plurality of apertures normal to a surface of the counter electrode that faces a substrate surface during electrodeposition; and (ii) a plurality of contact pins, each contact pin of said plurality of contact pins registered with, and configured to pass through, each aperture of said plurality of apertures and establish electrical contact with the substrate surface while being electrically isolated from the counter electrode during electrodeposition. That is, the pins supply plating potential to the substrate (working electrode), and although the pins pass through the counter electrode, they do not make electrical contact with the counter electrode. For example, the pins are insulated except for at their tips which make contact with the substrate during plating.

In other embodiments, the pins need not pass through the counter electrode, but rather can be configured between the working electrode and the counter electrode. In these embodiments, the plurality of contact pins are held by a support structure, portions of which may or may not lie between the working electrode and the counter electrode during plating. That is, in one embodiment a portion of the support structure which supports the pins resides between the working and counter electrodes during plating. In this embodiment, there may be other portions of the support structure that lie outside the area between the electrodes during plating. The support structure holds the contact pins and, during plating, the pins are positioned against the working electrode in order to create the ohmic contacts. In one embodiment, a positioning mechanism orients the support structure so that the contact pins are positioned against the working electrode in order to create the ohmic contacts during plating. One embodiment is an apparatus for electrodeposition including a support structure, the support structure including a plurality of contact pins, each contact pin of said plurality of contact pins configured to establish electrical contact with a substrate surface and thereby supply plating potential to the substrate, at least a portion of the support structure disposed between the substrate surface and a counter electrode during electrodeposition. In some embodiments, the support structure includes a positioning mechanism configured to orient the support structure between the substrate and the counter electrode during electrodeposition. In other embodiments, the support structure can reside in a fixed position, for example eclipsing a counter electrode, in the electrodeposition apparatus and the substrate is positioned so that the contact pins make contact with the substrate. In these embodiments, the substrate is positioned so that the support structure is between (at least that portion of the support structure which supports the pins) the substrate and the counter electrode during plating.

The support structure may have apertures for allowing flow of electrolyte through the support structure. In some embodiments, the apertures may have features for guiding electrolyte toward and/or away from the substrate surface during electrodeposition. In one embodiment, the support structure includes a plurality of rods, each supporting a number of contact pins, the plurality of rods, for example, supported by a frame or partial frame. In this way, electrolyte flow through the support structure is maximized since there is very little surface area to the support structure.

In some embodiments, the support structure resides entirely outside the counter and the working electrodes (not between them during plating). In these embodiments, the pins are constructed such that they are brought into the space between the counter and the working electrode (without passing through the counter electrode) and make contact with the working electrode without that portion of the support structure holding the contact pins residing between the two electrodes. In one example, the pins are of different lengths and, for example, have a non-linear configuration that allows a portion of the pin to traverse a span substantially parallel to the face of the electrodes and a portion that is substantially perpendicular to the face of the electrodes, the latter portion including the end of the pin that makes physical contact with the face of the working electrode during electrodeposition. Other pin configurations are contemplated, the pin can have virtually any shape, for example to accommodate electrolyte flow, other pins in the vicinity, spring characteristics of the pin needed based on, for example, the space the pin must span from the support structure to the substrate surface, etc. Pin materials and exemplary configurations are described in more detail herein.

In apparatus described herein, as in conventional electroplating, the electrical conductivity of the electrolyte completes the circuit between the working electrode and the counter electrode, where cations are reduced on the substrate (the cathode, working electrode). In one embodiment, uniform depositions are achieved, for example, by verification of pin connectivity (electrical communication with the conductive layer via the substrate film), for example, by configuring the contact pins as individually addressable and/or using resistors in conjunction with one or more contact pins, for example a resistor associated with each pin, in order to control deposition rates across the substrate via individual current control at each pin. In some embodiments, the resistors are placed in series with the pins. The resistors may be in or part of the pin structure itself and/or in the support structure and/or not configured as part of the pin or support structure.

Some embodiments described herein employ spring-type contact pins, compliant pins or rigid pins, depending upon the application. Particular materials and configurations of apparatus in accord with embodiments of the invention are described in more detail below.

Another embodiment is a method of electrodeposition, including: (a) establishing a plurality of ohmic contacts to a resistive substrate film using a plurality of contact pins, said plurality of contact pins electrically isolated from a counter electrode; and (b) electrodepositing a material from an electrolyte onto the substrate film. Methods described herein are meant to address films that, although having some intrinsic conductivity, have a resistivity that must be overcome in order for uniform plating to occur at the desired plating current. In some cases, additional films, which are significantly more resistive or semiconducting will lie between the less resistive film and the contact pin. In these cases ohmic contacts are established through the insulating or semiconducting film to the underlying more electrically conductive film in order to allow current to flow and electroplating to occur. One aspect of methods described herein is establishing such ohmic contacts via the substrate film from the front side, that is, the side facing a counter electrode during deposition onto the substrate film. In one embodiment, where the intermediate film is semiconducting, ohmic contact is established by exploiting materials that allow such contact at or around the plating voltage. In other embodiments, where the intermediate film is either insulating or semiconducting a breakdown voltage is applied to establish ohmic contact without the need for more expensive materials that match well to the substrate to allow ohmic contact at or around the plating voltage. Apparatus described herein are particularly useful for carrying out these methods.

Using methods described herein, higher plating currents can be used without sacrificing film uniformity, either in thickness of the film or the chemical stoichiometry of the film. Particular aspects of methods are described in more detail below.

DETAILED DESCRIPTION

A. Making a Solar Cell

Figure 1:
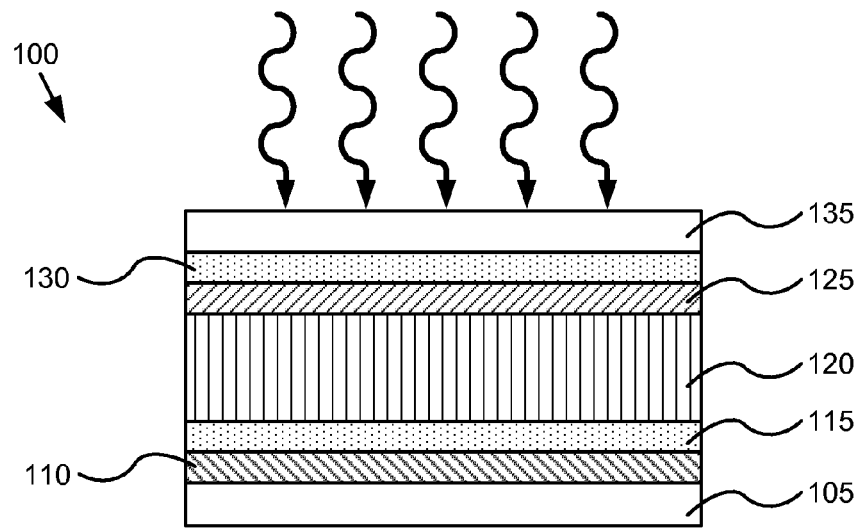
FIGS. 1 and 2 depict cross-sections of solar cell photovoltaic stack structures.

FIG. 1 depicts a simplified diagrammatic cross-sectional view of a typical thin film solar cell, 100. As illustrated, thin film solar cells typically include the following components: back encapsulation, 105, substrate, 110, a back contact layer, 115, an absorber layer, 120, a window layer, 125, a top contact layer, 130, and top encapsulation layer, 135.

Back encapsulation can generally serve to provide encapsulation for the cell and provide mechanical support. Back encapsulation can be made of many different materials that provide sufficient sealing, moisture protection, adequate mechanical support, ease of fabrication, handling and the like. In many thin film solar cell implementations, back encapsulation is formed from glass although other suitable materials may be used.

A substrate layer can also be used to provide mechanical support for the fabrication of the solar cell. The substrate can also provide electrical connectivity. In many thin film solar cells, the substrate and back encapsulation are the same. Glass plate is commonly used in such instances.

A back contact layer can be formed from a thin film of material that provides one of the contacts to the solar cell. Typically, the material for the back contact layer is chosen such that the contact resistance for the electrons/holes flowing from/to the absorber layer is minimized. This result can be achieved by fabricating an ohmic or a tunneling back contact layer. This back contact layer can be formed from many different materials depending on the type of thin film solar cell. For example, in copper indium gallium diselenide (CIGS) solar cells, this layer can be molybdenum. In cadmium telluride (CdTe) thin film solar cells, this back contact layer can be made, for example, of nickel or copper, or graphite. These materials are merely illustrative examples. That is, the material composition of the back contact layer is dependent on the type of absorber material used in the cell. The thickness of a back contact layer film is typically in the range of a few microns.

The absorber layer is a thin film material that generally absorbs the incident photons (indicated in FIG. 1 by the squiggly lines) and converts them to electrons. This absorber material is typically semiconducting and can be a p-type or an n-type semiconductor. An absorber layer can be formed from CIGS, CdTe or amorphous silicon. The thickness of the absorber layer depends on the semiconducting material, and is typically of the order of microns, varying from a few microns to tens of microns.

A window layer is also typically a thin film of semiconducting material that creates a p-n junction with the absorber layers and, in addition, allows the maximum number of photons in the energy regime of interest to pass through to the absorber layer. The window layer can be an n or p-type semiconductor, depending on the material used for the absorber layer. For example, the window layer can be formed from a cadmium sulphide (CdS) n-type semiconductor for CdTe and CIGS thin film solar cells. The typical thickness of this layer is of the order of hundreds to thousands of angstroms.

A top contact is typically a thin film of material that provides one of the contacts to the solar cell. The top contact is made of a material that is transparent to the photons in the energy regime of interest for the solar cell. This top contact layer is typically a transparent conducting oxide (TCO). For CdTe, CIGS, and amorphous silicon thin film solar cells, the top contact can be formed from, for example, indium tin oxide (ITO), aluminum doped zinc oxide (ZnO) or flourine doped tin oxide ($SnO_2$). The top contact layer thickness can be of the order of thousands of angstroms.

A top encapsulation layer can be used to provide environmental protection and mechanical support to the cell. The top encapsulation is formed from a material that is highly transparent in the photon energy regime of interest. This top encapsulation layer can be formed from, for example, glass.

Thin film solar cells are typically connected in series, in parallel, or both, depending on the needs of the end user, to fabricate a solar module or panel. The solar cells are connected to achieve the desired voltage and current characteristics for the panel. The number of cells connected together to fabricate the panel depends on the open circuit voltage, short circuit current of the cells, and on the desired voltage and current output of the panel. The interconnect scheme can be implemented, for example, by laser scribing for isolation and interconnection during the process of the cell fabrication. Once these panels are made, additional components such as bi-pass diodes, rectifiers, connectors, cables, support structures etc. are attached to the panels to install them in the field to generate electricity. The installations can be, for example, in households, large commercial building installations, large utility scale solar electricity generation farms and in space, for example, to power satellites and space craft.

As mentioned above, electrodeposition is an attractive methodology for depositing various layers of thin film solar cells. Processes have been developed for the deposition of the back contact, absorber, window and top contact layers using electrodeposition.

For illustration purposes, electrodeposition is described herein as being used in the fabrication of CdTe-based solar cells although electrodeposition can be used to fabricate any number of other types of solar cells or other types of thin films products and/or devices. That is, the invention is not limited to this exemplary electrodeposition chemistry.

Solar cell photovoltaic stacks are conventionally constructed in an order starting from, for example, a top encapsulation layer, a top contact layer, a window layer, an absorber layer, a back contact layer and so on, that is, in an order opposite of the description of the layers with reference to FIG. 1.

Figure 2:
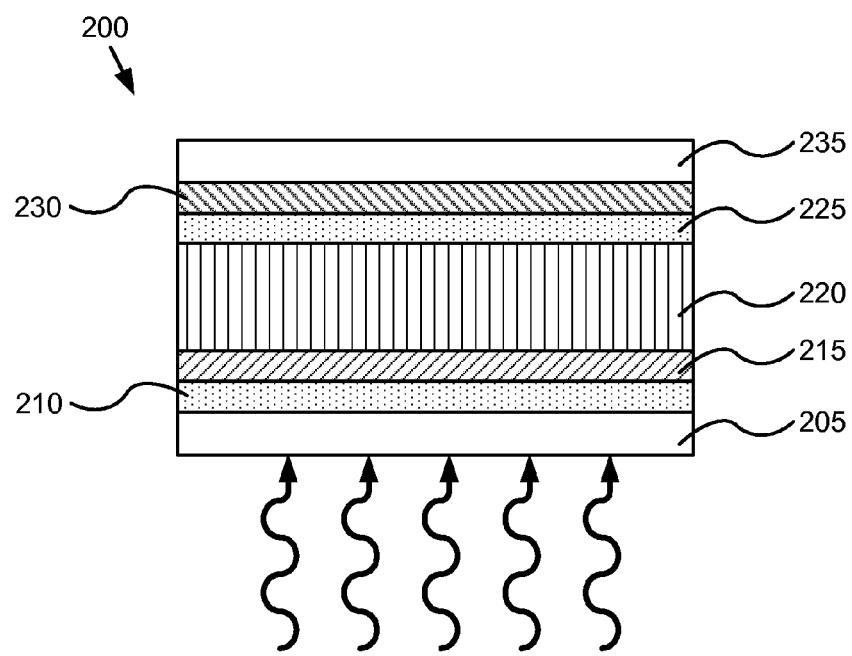

FIG. 2 shows a diagrammatic illustration of conventional photovoltaic stack formation. The process starts with the top encapsulation layer, and the cell stack is built by subsequent depositions of top contact layer, window layer, absorber layer, etc. Other layers may be formed in addition to the described layers and formation of some of the described layers is optional, depending on the desired cell stack structure.

Referring again to FIG. 2, the TCO-coated glass (for example, the top encapsulation layer 205 and top contact layer 210) can be initially cleaned, dried, cut to size, and edge seamed. Float glass with transparent conductive oxide coatings, for example indium tin oxide, doped zinc oxide or doped tin oxide, are commercially available from a variety of venders, for example, glasses sold under the trademark TEC Glass™ by Pilkington of Toledo, Ohio, and SUNGATE™ 300 and SUNGATE™ 500 by PPG Industries of Pittsburgh, Pa. TEC Glass™ is a glass coated with a fluorinated tin oxide conductive layer. A wide variety of solvents, for example deionized water, alcohols, detergents and the like, can be used for cleaning the glass. As well there are many commercially available industrial-scale glass washing apparatus appropriate for cleaning large substrates, for example, Lisec™ (a trade name for a glass washing apparatus and process available from (LISEC Maschinenbau Gmbh of Seitenstetten, Austria).

Methods described herein are exemplified as being carried out on substantially flat substrates, such as conventional glass substrates. However, methods described herein can also be employed substrates with non-planar geometries, such as cylinders, curved and/or irregular contoured surfaces, depending on the desired configuration of the final product photovoltaic device. One embodiment is any method described herein wherein the substrate comprises a curved architecture, for example a cylinder, a parabola, a cone, a hemisphere, and the like. The curved architecture can be convex, concave or have both components, depending upon the need.

Once the TCO coated glass is cleaned, a CdS layer, 215, may then be deposited, for example, by using an aqueous solution of, for example, a cadmium salt and elemental sulfur composition. The solution does not have to be aqueous. That is, other solvents, such as dimethylsulfoxide (DMSO), can be used. This deposition can be done using electrodeposition. For electrodeposition, the ITO coated glass can form one of the electrodes. The other electrode can be, for example, made of graphite, and the electrolyte can be, for example, a DMSO solution of a cadmium salt and elemental sulfur. Potential is applied between the electrodes so that CdS is deposited from the solution onto the ITO coated glass substrate. Another method of depositing the CdS layer is chemical deposition, for example via wet chemistry or dry application such as PVD or CVD. The CdS deposited is an n-type semiconductor and its thickness is typically between 500 Å and 1 µm. Subsequent to the deposition, the layer can be annealed, for example under an inert atmosphere such as argon, to achieve film densification and grain growth to improve the electrical and mechanical properties of the CdS film.

A cadmium telluride layer, 220, can then be electrochemically deposited on the CdS/TCO/Glass stack (now a substrate for electrodeposition), for example, from an acidic or basic media containing a cadmium salt and tellurium oxide. In this process, the CdS/TCO/Glass substrate forms one of the electrodes and platinum or other materials can be used as the other electrode. The electrolyte can contain an acidic or basic media, in solvents such as water, DMSO or other solvents, with a cadmium salt and tellurium oxide, for example. Films of thickness ranging from 1 to 10 µm are typically deposited. Cadmium telluride films may then be annealed at approximately 400° C. in an air or oxygen or $CdCl_2$ environment so as to improve the electrical properties of the film and also to convert the CdTe film to a p-type semiconductor. It is believed that these methods optimize grain size and thus improve the electrical properties of the films.

After this CdTe deposition and annealing, a laser scribing process is typically performed to remove CdS and CdTe and TCO from specific regions (not shown). Then a second laser scribing step is performed in which CdS, and CdTe are removed from specified regions. In this scribing operation, the laser scribing is utilized such that CdS and CdTe are removed from specific regions of the solar panel. However, the conductive oxide (for example, Al doped ZnO or ITO) is not removed by the laser scribe.

A back contact layer, 225, can then be deposited on the CdTe layer, using for example sputtering or electrodeposition. For example, copper, graphite, nickel and/or other metals, alloys and composites can be used for the back contact layer. This back contact fabrication step can be followed by an anneal, for example, at temperatures of between about 150° and about 200° C. to form an ohmic contact. The back contact layer can cover the CdTe layer and also fill the vias (not shown) created in the CdTe/CdS layer by the laser scribing process.

After back contact layer deposition and annealing, laser scribing can typically be used to remove the back contact layer material, CdTe layer material, and CdS layer material from specific areas. This removal step can complete the process for isolation and interconnecting the solar cells in series in the solar panel/module.

After the deposition of the back contact layer, an encapsulation layer, 230, can be applied, for example, using ethylvinyl acetate (EVA). Encapsulation protects the photovoltaic stack. Glass, 235, can be added for further structural support (and protection) of the stack.

The above described fabrication process represents a brief outline and many variants of this process can be employed for the fabrication of CdTe thin film solar cells. For other types of thin film solar cells, different chemicals, etc. can be employed. In this description, example process steps have been described for illustrative purposes. Other steps would typically include additional details of the laser scribing and ablation steps employed for the fabrication of the interconnect schemes and cell isolations, multiple clean and drying steps between the different layer depositions and the like. Values for the layer thicknesses, anneal temperatures, chemical composition etc. described herein are merely illustrative and are not meant to limit the scope of the invention. These values can vary across a wide range as processes are optimized for many different output variables.

Figure 3:
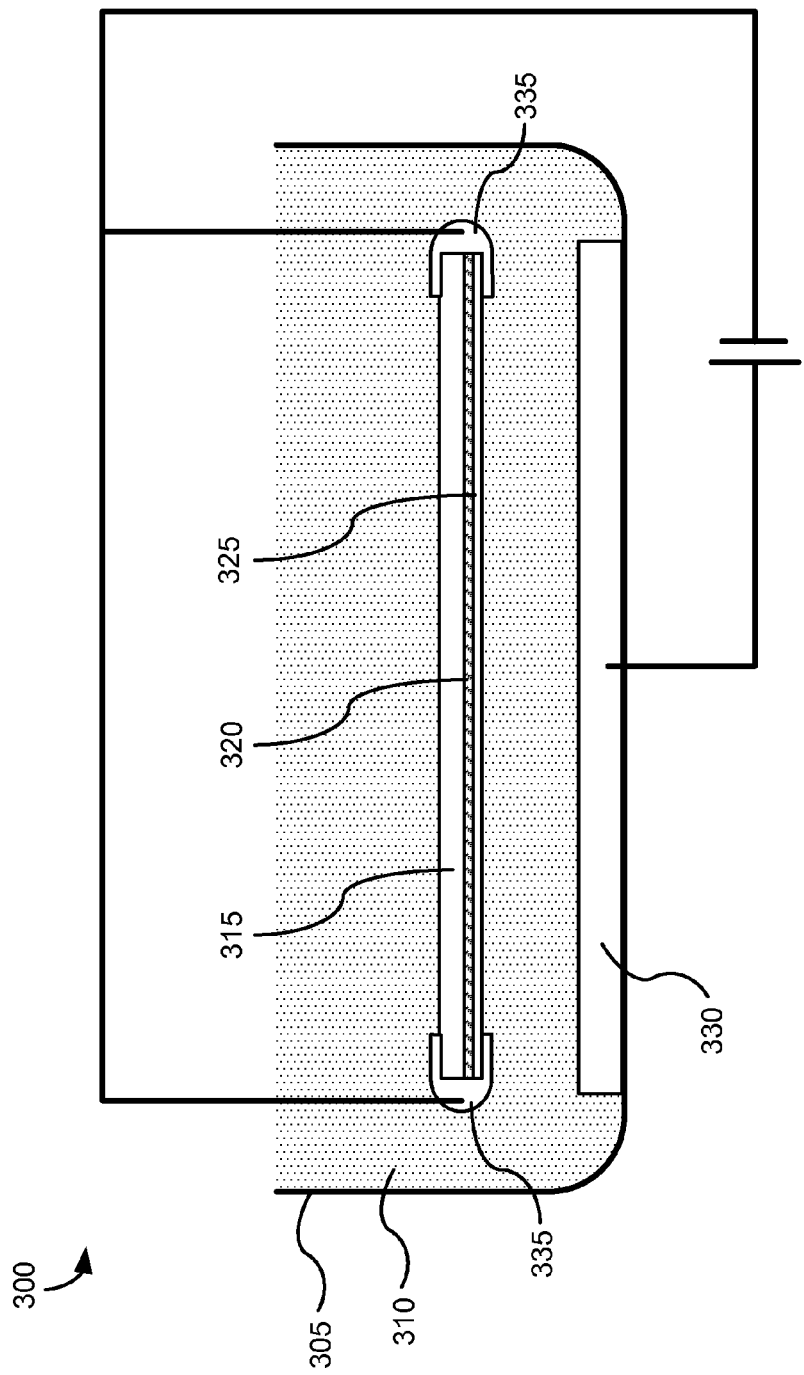
FIG. 3 depicts a cross-section of a conventional electrodeposition apparatus.

FIG. 3 shows a cross sectional schematic of a conventional electrodeposition apparatus, 300, that is used for depositing various layers for solar cell fabrication. This apparatus configuration can be employed, for example, for electrodeposition of CdTe on a glass substrate coated with TCO and CdS. Apparatus 300 includes a large tub, 305, which holds the electroplating solution, 310, in which a substrate, in this example glass, 315, with a TCO, 320, and a CdS layer, 325, (the TCO and CdS layer, collectively, are the working electrode) and a counter electrode, 330, are immersed. Deposition on the working electrode is achieved by application of an electric field between the electrodes and deposition occurs via reduction of an ionic species from the electrolyte onto the substrate working electrode, in this example onto CdS layer 325.

In a typical configuration electrodeposition, contacts, 335, to the working electrode are made at the edges of the working electrode as depicted. This configuration works well when the working electrode is highly conductive, for example metallic, and therefore has little sheet resistance. However when the electrodeposition is performed on, for example, CdS/TCO/glass, where CdS/TCO is the working electrode, this configuration is problematic. For example, when using electrodeposition to achieve high quality, stoichiometrically-correct films, the potential at the surface of the working electrode has to be kept fairly uniform. For example for electrodeposition of CdTe on a CdS/TCO, the potential across the full surface of the working electrodes can not vary by more than of the order of millivolts. The thickness of the film deposited in electrodeposition is proportional to the total charge that flows through the system, and the total charge flowing through the system is a function of the current and the time for which the current flows. Since electrodeposition on large area substrate working electrodes is desirable, and potential drop across such substrate's large surfaces occurs due to having only a peripheral supply of potential, deposited film uniformity suffers unless steps are taken to mitigate potential drop across the substrate and/or underlying electrically conductive layer, for example, a transparent conductive oxide.

In order to minimize the time that it takes to achieve a given thickness of film, the current flowing through the system has to be increased. For example, for electrodeposition of CdTe on a CdS/TCO/Glass substrate the sheet resistance of the TCO is on the order of 2-20 ohms/square.

The area of a typical substrate is on the order of square meters. For this resistance and area, if the substrate, for example via the TCO, is contacted only from the periphery, and the potential drop across the substrate surface has to be maintained to within millivolt tolerances, for example tens to hundreds of millivolts, then the total current is limited to a range on the order of tens to hundreds of micro-amps per square centimeter. At these currents, for example if a few microns of CdTe film is to be deposited, it can take on the order of several hours to deposit the CdTe film. This severely limits the throughput of conventional electrodeposition equipment and significantly increases the cost of production of solar cells. If the current is increased during the deposition in an attempt to improve the throughput of the equipment, then the result is significantly higher potential drops and corresponding non-uniformities in the CdTe film thickness and composition across the surface of the substrate, which results in poor quality solar cells.

B. Apparatus and Methods

The inventors have found that many of the above-described limitations of conventional electrodeposition can be overcome. In certain embodiments, the substrate is contacted in a manner that alleviates the potential drop constraints and permits the use of significantly higher deposition currents to improve throughput while maintaining high-quality uniform films.

One embodiment is an apparatus for electrodeposition, including: (i) a counter electrode including a plurality of apertures normal to a surface of the counter electrode that faces a substrate surface during electrodeposition; and (ii) a plurality of contact pins, each contact pin of the plurality of contact pins registered with and configured to pass through each aperture of the plurality of apertures and establish electrical contact with the substrate surface but be electrically isolated from the counter electrode during electrodeposition. During plating, the contact pins are part of the circuit and there is plating current traversing the electrodes, so "electrically isolated" in this context means that the pins do not make electrical contact with the counter electrode and therefore short the plating circuit. In certain embodiments, the pins are covered with an insulating material except for their tips which make physical contact with, and supply plating charge to, the working electrode (substrate). The insulating material on the pins may touch the counter electrode, for example, where the pins pass through apertures in the counter electrode. In one embodiment, the contact pins include a material, for example made of and/or coated with, that does not dissolve in the electrolyte nor plate under the plating conditions employed, although the material may be electrically conductive. In this latter context, "electrically isolated" means that the pins do not make physical contact with the counter electrode, otherwise the plating circuit would be shorted.

Figure 4A:
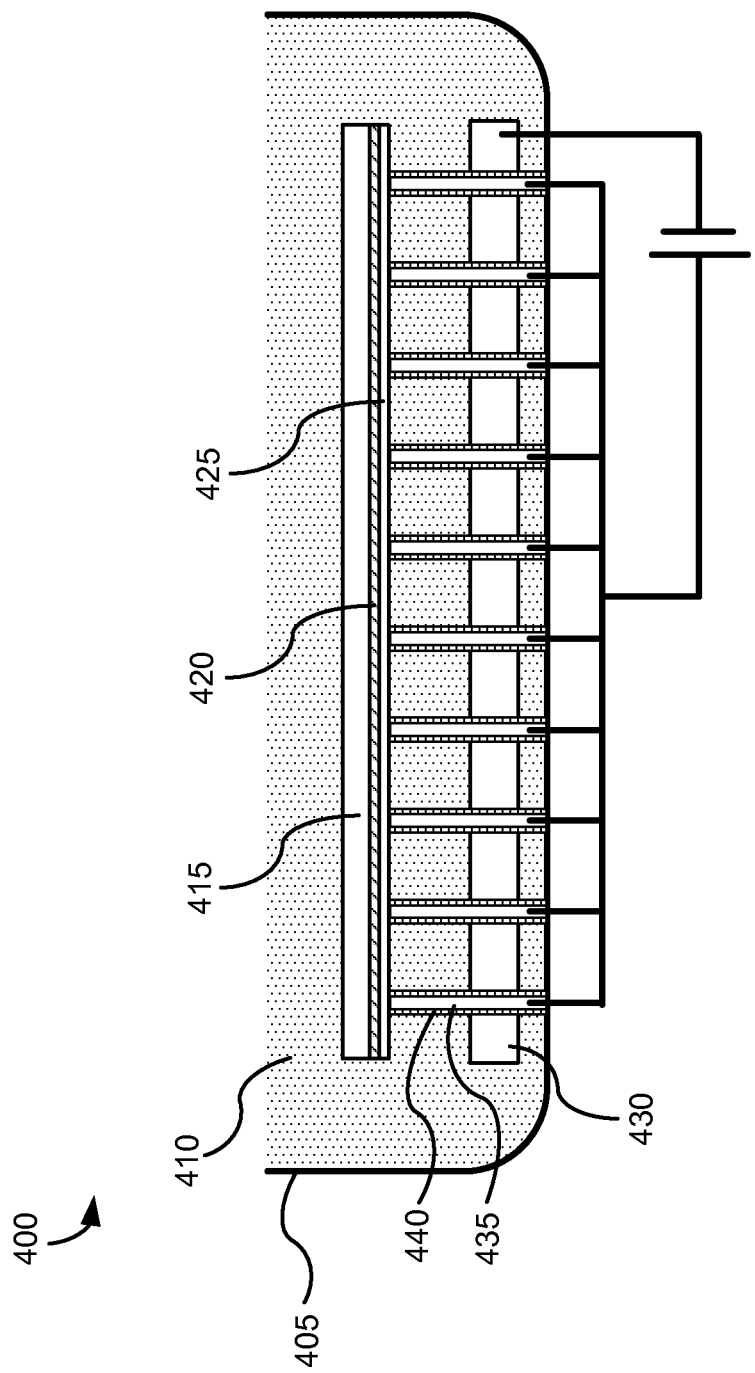
FIG. 4A depicts cross-section of electrodeposition apparatus in accord with embodiments of the invention.
Figure 4B:
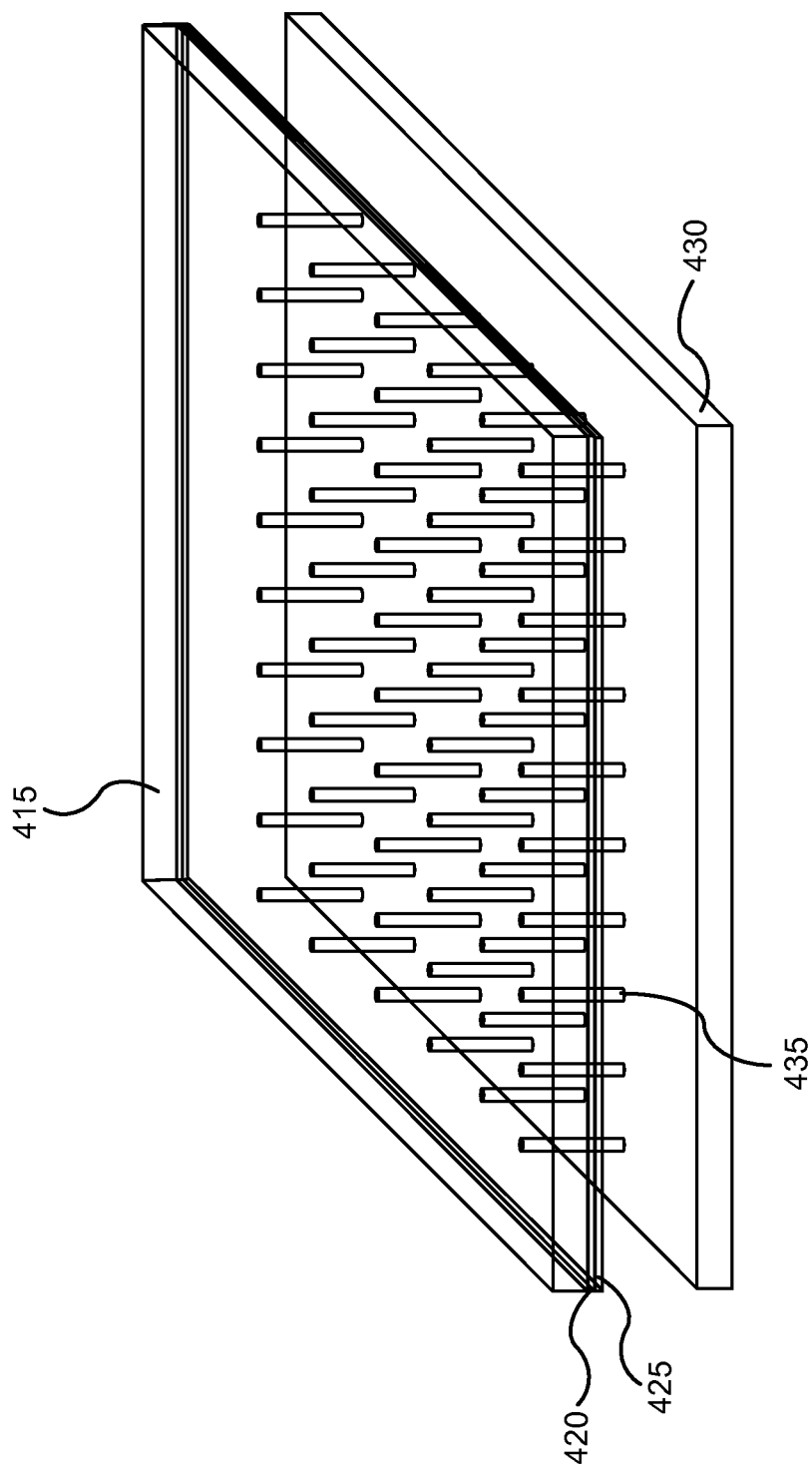
FIG. 4B depicts a perspective of components of electrodeposition apparatus in accord with embodiments of the invention.

FIG. 4A depicts a cross-section of an electrodeposition apparatus, 400, in accord with embodiments of the invention. Apparatus 400 includes a tub, 405, for the electrolyte, 410. During deposition, a substrate, in this example glass substrate 415, having a TCO, 420, and a CdS film, 425, thereon, makes contact with a plurality of contact pins (or probes) 435. Contact pins are electrically isolated from a counter electrode, 430, in this example via an insulating coating, 440, on contact pins 435. Although the backside (top side as depicted) of glass substrate 415 is depicted as being exposed to electrolyte 410, embodiments of the invention provide electrolyte contact to only the plating face of the substrate. For example, substrate handling and positioning components (not depicted) can seal and protect the backside of the substrate during film deposition and/or the substrate is only immersed in the electrolyte sufficiently to expose the plating side to electrolyte. During electrodeposition, a potential is applied across the electrodes, in this example CdS film 425 and counter electrode 430, in order to deposit an ionic species from electrolyte 410 and onto CdS film 425. Depending on the type of pins used, the pins can be, for example, fixed or slideably engaged with counter electrode 430. FIG. 4B depicts a perspective of the substrate with layers 415, 420 and 425, as well as pins 435 and counter electrode 430. Pins 435 can be arranged in various patterns and pin densities depending on the desired outcome, as will be described in more detail below.

Although embodiments described herein include a plurality of contact pins to make corresponding ohmic contacts to the working electrode, the invention is not so limited. That is, embodiments described herein may also include conventional-type peripheral electrical contacts, for example as depicted described in relation to FIG. 3, in electrical contact with the substrate, in addition to the plurality of contacts established by the contact pins. Although the contact pins described herein may be sufficient to apply potential to the working electrode in order to, for example, obtain uniform electrodeposition along with high deposition rates, it may be desirable to use both conventional-type peripheral contacts along with contact pins described herein. For example, conventional equipment may be modified to add contact pins and related hardware as described herein. In such a scenario, less contact pins may be need in order to achieve the desired plating performance parameters. Thus, one embodiment is any embodiment described herein, including peripheral electrical contact to the working electrode. Specifically, one embodiment is a method as described herein, further including making peripheral electrical contact to the working electrode during electrodeposition. Another embodiment is an apparatus as described herein, further including one or more contacts configured to make electrical contact to the working electrode concurrently with the plurality of contact pins. Embodiments described herein include those where the potential to each pin may be varied across a matrix of pins. Additionally, the potential to the one or more conventional type contacts to the periphery of the working electrode may be varied concurrently with varying potential to the contact pins.

The contact pins can include at least one of a rigid pin, a compliant pin and a spring-type pin. That is, some embodiments of the invention include apparatus with combinations of pin type, depending on the desired outcome of the deposition. A rigid pin is a pin that is relatively rigid, that is, the pin does not deform or bend substantially upon contact with the substrate. A compliant pin is a pin that does have some give, that is, it can deform or bend upon contact with the substrate. Compression contact between a compliant pin and the substrate can be varied in force by, for example, using compliant pins made with varying amounts of compliancy, for example, by varying thickness of pins made of a single material and/or by making pins from different materials and/or making bends and/or flexures on the pins that provide compliance. A spring-type pin is a pin, with a rigid or compliant component, that specifically can deform or otherwise move or be displaced vertically with respect to the substrate. That is, a spring-type pin makes a compression contact with the substrate via a mechanism such as a spring, a pneumatic device, an elastomeric member and the like. Thus a spring-type pin can have a rigid pin component with, for example, a spring device that allows the rigid pin to move normally to the surface of the substrate upon engagement with the substrate such that a compression contact is made with the substrate. One embodiment of the invention is an apparatus as described with rigid contact pins. One embodiment of the invention is an apparatus as described with compliant contact pins. One embodiment of the invention is an apparatus as described with spring-type contact pins.

The contact pins can be made of materials that are chemically resistant to the electrolyte and/or are coated with a material that protects them from the electrolyte and also may serve as an insulating material to electrically isolate the pins from the counter electrode. Contact pins can be made of a variety of metallic materials or coatings. Suitable materials for contact pins of the invention include one of gold, titanium, tungsten, steel, titanium nitride, and indium or alloys of these and other metallic materials. In one embodiment, the contact pins include a material, for example made of or coated with, that does not dissolve in the electrolyte nor plate under the plating conditions employed. That is, materials need not necessarily be coated with an additional material to protect the pins from the corrosive electrolyte and/or protect the substrate from contamination from material dissolved from the pins by the electrolyte. Suitable materials for this embodiment include gold, tungsten, titanium, titanium nitride, steel, and indium or alloys of these and other metallic materials. One of ordinary skill in the art would recognize that future advancements in materials are inevitable and materials with substantially equivalent properties to those described herein are within the scope of the invention.

Preferably, the pins are made of material that makes good electrical contact with the substrate. Thus the material used in the tip or contact area of the pin can be tailored to the particular needs of the deposition system and chemistry. For example, if the substrate consists of CdS/TCO/Glass, where deposition is to occur on a film of CdS, then the tips of the contact pins can be coated with or made of indium and/or an alloy of indium. Indium makes a good ohmic contact with CdS under plating conditions without the need to apply higher potentials to break down resistance to ohmic contact. "Ohmic contact" means a region on the substrate where the current-voltage (I-V) curve of the substrate in the localized contact region is linear and symmetric. Put another way, an ohmic contact is a contact with voltage independent resistance, that is, a contact having a negligible resistance regardless of the polarity of the applied voltage. Thus, since the resistance is negligible at the ohmic contacts, plating potential can be supplied to an underlying electrically conductive layer without substantial resistance from the substrate layer. Also, the contact pins should be mechanically robust to minimize wear and tear and reduce operating costs and down time of the tool, and, as mentioned, should be chemically compatible (either coated with insulator or not) with the electrolyte being used, and preferably are cost effective.

In the example in FIGS. 4A and 4B, contact pins 435 are electrically isolated from counter electrode 430 via an insulator material, 440, coated on the pins (except for the contact area where the pins engage the substrate). Electronic isolation can be achieved either by appropriate spacing, that is, non-contact with the counter electrode and/or via appropriately configured insulating materials. As mentioned, in one embodiment this is achieved by coating the contact pins with an electrically insulating material everywhere except at the tip of the probes where they make electrical contact with the substrate. Suitable electrically insulating materials include at least one of polytetrafluoroethylene (PTFE), perfluoroalkoxy (PFA), polytetrafluoroethylene perfluoromethylvinylether (MFA), fluorinated ethylene propylene (FEP), ethylene tetrafluoroethylene (ETFE), ethylene chlorotrifluoroethylene (ECTFE), polyvinylidene fluoride (PVDF), tetrafluoroethylene hexafluoropropylene vinylidene fluoride (THV), polyetheretherketone (PEEK), polyetherimide (PEI) and poly(para-xylylene) sold commonly as "Parylene"). Coating the contact pins with an electrically insulating material, depending on the material chosen, can provide the benefit of preventing deposition on the pins during electrodeposition, which could be beneficial to the life time of the pins and also prevent contamination of the electrolyte from the pins. One embodiment of the invention is an apparatus as described above, where the plurality of contact pins includes at least a subset of pins that are coated with an electrically insulating material except for a portion of each pin that makes contact with the substrate surface during electrodeposition. That is, embodiments of the invention include apparatus that have a plurality of contact pins, where the pins vary in configuration, materials, spacing and the like. For example, electrodeposition can be tailored by voltage regimes applied across the pins, but also by varying the pin materials across a grid of pins, spacing of the pins, pressure of contact of the pins and the like.

Coating the pins is but one approach to electrically isolating the contact pins from the counter electrode. There are many other ways in which the contact pins can be electrically isolated from the counter electrode. In one embodiment, the apertures in the counter electrode through which the contact pins pass are coated with an insulating material as described above. Embodiments of the invention include combinations of electrical isolation configurations as described above. For example, electrically insulating the pins, apertures in the counter electrode, using appropriate spacing between the contact pins and the counter electrode (and each other), etc. can be used in combination to provide suitable electrical isolation of the contact pins from the counter electrode. Any of the above electronic isolation methods can be employed in any combination.

Figure 8:
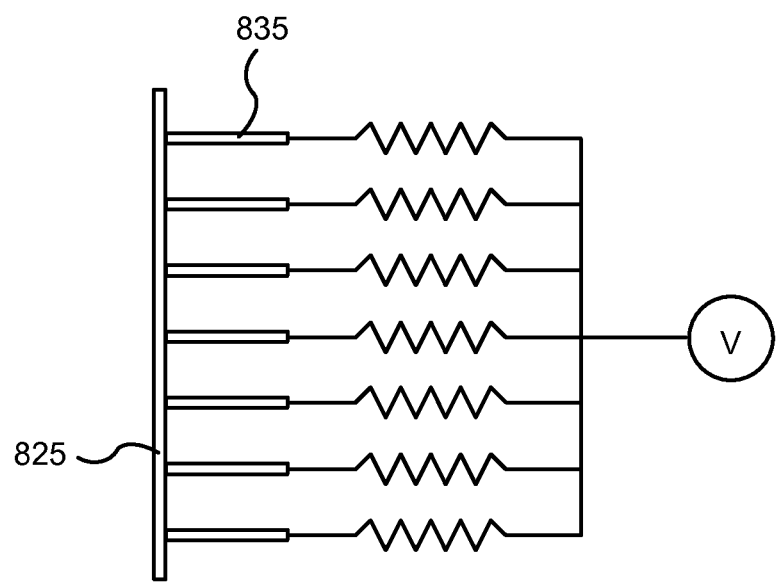
FIG. 8 shows one example of how each contact pin circuit includes a resistor.

The total resistance of the circuit through which the potential is applied to the pin can be very small since the pin contact is intentionally made ohmic. One embodiment of the invention incorporates pins connected in parallel to the substrate. This may be hundreds or even thousands of pins, depending on the pin density and the area of the substrate. FIG. 8 illustrates this embodiment. Substrate 825, for example having a CdS film thereon (not depicted), is contacted by pins 835. As evident from the circuit diagram, each pin 835 has an associated resistor, the pins are wired in parallel to each other, but the resistors are wired in series with each pin. Depending upon the application, the resistors associated with the plurality of contact pins may have different values or the same value. In one embodiment, each of the resistors, independently, has a (resistance) value of between about 1 ohms and about 500 ohms. In another embodiment, each of the resistors, independently, has a value of between about 5 ohms and about 100 ohms. In another embodiment, each of the resistors, independently, has a value of between about 10 ohms and about 50 ohms. This embodiment includes apparatus configurations where the pins pass through the counter electrode or do not pass through the counter electrode (i.e. the pins are supported by a structure that is positioned between the working and counter electrode during electrodeposition or where the support structure does not lie between the electrodes during plating, but rather only the contact pins do). In this embodiment small variations in the external wiring and the contact resistances of the pins can cause large variations in the current passing through nominally similar pins. These current variations produce accompanying potential variations. Combined, these variations can cause significant non-uniformity in the deposited layer. Thus, in one embodiment, the plating potential is controlled so that all of the pins contacting the substrate nominally exhibit the same voltage and current performance. This issue can be addressed by applying different potentials externally to each of the pins to compensate for the differences in the resistances. In one embodiment, a resistor having a significantly larger (and characterized) resistance than the resistance of the wiring and the resistance of the contacts is wired in series with each pin. In this way, the resistance of the (completed) circuit is dominated by the resistor since any differences in the resistance of the wiring, the contacts, and/or the contact pins is a relatively small percentage of the total resistance of the circuit.

In one embodiment, the potential to each pin is varied in order to optimize current density and thus film thickness, uniformity and the like. The control circuit and/or hardware associated with the pins is configured to be able to apply different potentials to different pins to optimize film thickness composition or other properties. In one embodiment, this is achieved by varying the resistance value of the resistor in series with the each of the pins or with groups of pins. Because the potential drop from a voltage supply to the working electrode is controlled by the resistor, the pin spacing and the inherent film resistance, varying the resistor resistance values will change the potential applied to the working electrode through the pins and provide a relatively simple method to tailor the potential and electrodeposition profile in the area adjacent to each pin. For example, contact pins in interior regions of the working electrode may have lower resistance than those in outer regions where, for example, auxiliary peripheral contact may be employed. Also, some embodiments described herein have contact pins of substantially the same length, while others have contact pins whose length may vary substantially (e.g. where the support structure for the pins does not lie between the electrodes during deposition). The length of the contact pin, along with the materials from which it is made, and for example, the diameter of the pin, will affect the electrical resistance of the pin itself. In embodiments where varying pin length is employed, the fact that different pins will have different resistance values is taken into account when electrodepositing and/or applying resistors to each pin. Alternatively, in one embodiment, pins of different length are made of different materials and/or the same material but of different dimensions, in order to achieve the same or similar resistance value for each pin. The latter embodiment can allow, for example, using the same resistor type despite pins having varying length, since each pin has the same resistance or resistance within a given range of all other pins.

The counter electrode can be made of many different materials as would be understood by one of ordinary skill in the art. In general, the counter electrode is electrically conductive, chemically compatible with the electrolytic solution, and meets any cost considerations. In one embodiment, the counter electrode includes at least one of platinum, graphite, titanium, tungsten, titanium suboxide (for example as sold under the trade name, Ebonex™, by Atraverda of South Wales, UK) and titanium nitride. In one embodiment, titanium or other suitable metal or alloy is coated using ruthenium oxide, titanium suboxide, iridium oxide (for example as sold under the trade name MMO by William Gregor Ltd. of London, UK), titanium nitride and combinations thereof.

The spacing of contact pins can be optimized to achieve the best throughput possible which will be dictated by the particulars of the process. For example, if the conductive layer (for example, the TCO layer of a CdS/TCO/glass substrate) of the substrate has a sheet resistance of 10 ohms per square and the current desired during the deposition is 2 mA per square centimeter, then a contact pin spacing of, for example, 2 cm will result in a maximum potential drop across the whole substrate of less than 20 mV. Thus, precise control of the potential drops across the surface of the substrate can be tailored by appropriate pin spacing (which also depends on pin materials and configurations, for example, contact area) even at high deposition currents so as to allow the fabrication of uniform layers at high throughputs. In one embodiment, the plurality of contact pins includes a pin density of between about 100 pins/$m^2$ and about 10,000 pins/$m^2$. In one embodiment, the plurality of contact pins includes a pin density of between about 500 pins/$m^2$ and about 1000 pins/$m^2$, in another embodiment between about 550 pins/$m^2$ and about 750 pins/$m^2$, and in yet another embodiment between about 650 pins/$m^2$ and about 675 pins/$m^2$, in another embodiment about 667 pins/$m^2$. In another embodiment, the plurality of contact pins includes a pin density of between about 2000 pins/$m^2$ and about 3000 pins/$m^2$, in another embodiment between about 2250 pins/$m^2$ and about 2750 pins/$m^2$, and in yet another embodiment between about 2400 pins/$m^2$ and about 2600 pins/$m^2$, in another embodiment about 2500 pins/$m^2$.

Some embodiments described herein include the plurality of contact pins being part of a support structure, separate from the counter electrode. These support structures may, or may not, have a number of apertures and thus a smaller percentage of physical area of support structure in which the pins may reside, for example, a grid or screen type structure. It is understood that the aforementioned pin densities still apply, that is, the pins are spaced on the appropriate portions of the support structure to achieve the desired pin densities. Moreover, apparatus described herein include combinations of pin configurations and arrangements. For example, one embodiment is an electrodeposition apparatus that includes pins that pass through the counter electrode as well as pins supported by a support structure as described herein. For example, in one configuration, there is a first plurality of contact pins that pass through the counter electrode in a central region of the counter electrode, as well as a second plurality of contact pins supported by a support structure, where a portion of the support structure may or may not lie between the electrodes during electrodeposition.

In one embodiment, the contact pins, whether passing through a counter electrode, as part of an intervening support structure between the working and counter electrodes, or both, including the area in between the pins, occupy a total area of between about 1 $m^2$ and about 10 $m^2$. In another embodiment, the contact pins, including the area in between the pins, occupy a total area of between about 1.5 $m^2$ and about 5 $m^2$, in another embodiment, between about 2 $m^2$ and about 4 $m^2$. In these embodiments, the pin densities described herein apply.

As mentioned above, optimal pin spacing can depend on, for example, the contact area of the contact pins, that is, where a pin interfaces with the surface of the plating substrate. Since each pin may contact the substrate slightly differently, the contact area of the individual pins may be expressed in terms of an average contact area. Contact pins can have surfaces that make contact with the substrate where the surfaces can have various shapes to optimize contact, for example, flat surfaces or pointed or wedge-shaped surfaces that dig into the substrate to establish better electrical contact. The contact pins can have various cross-sections, for example, to facilitate manufacturing and/or electrolyte flow around the pins. In many cases, contact pins will be relatively thin, so that the average contact area is reflected in the average diameter of the pin. In one embodiment, each pin of the plurality of pins has an average diameter of between about 10 microns and about 1000 microns, in another embodiment between about 100 microns and about 800 microns, in another embodiment between about 150 microns and about 750 microns, in another embodiment between about 200 microns and about 600 microns, and in yet another embodiment between about 250 microns and about 500 microns.

Smaller diameter pins are useful for a number of reasons, one of which is creating smaller "dead" areas in the deposited film. That is, where the pins contact a substrate, deposition of the new film is blocked and thus "voids" or holes are created after the pins and the substrate are disengaged. These holes in the newly deposited film must be appropriately addressed in order to create, for example, a functional photovoltaic stack. This aspect is described in more detail below, see for example the discussion of FIGS. 7A-D.

Figure 4C:
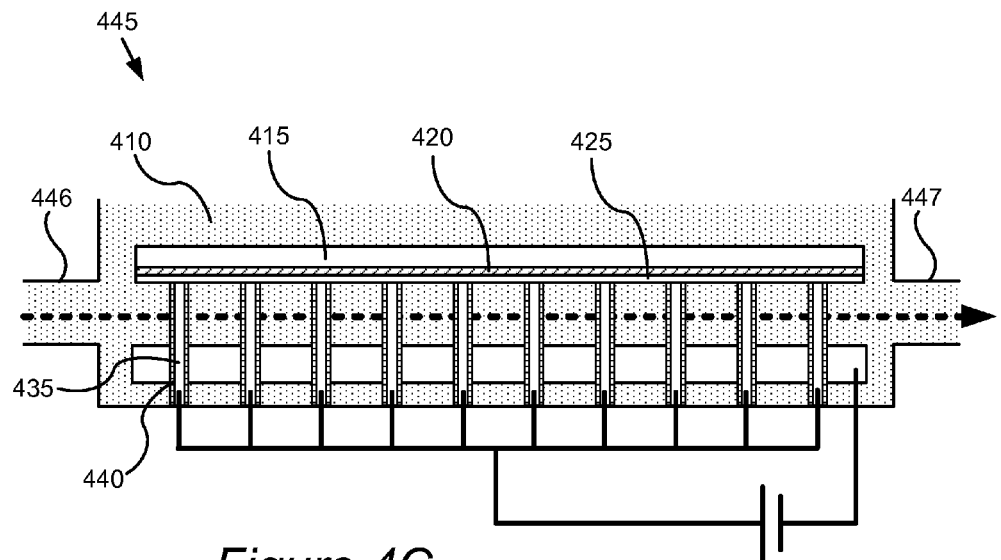
FIG. 4C depicts a cross-section of components of electrodeposition apparatus in accord with embodiments of the invention.
Figure 4D:
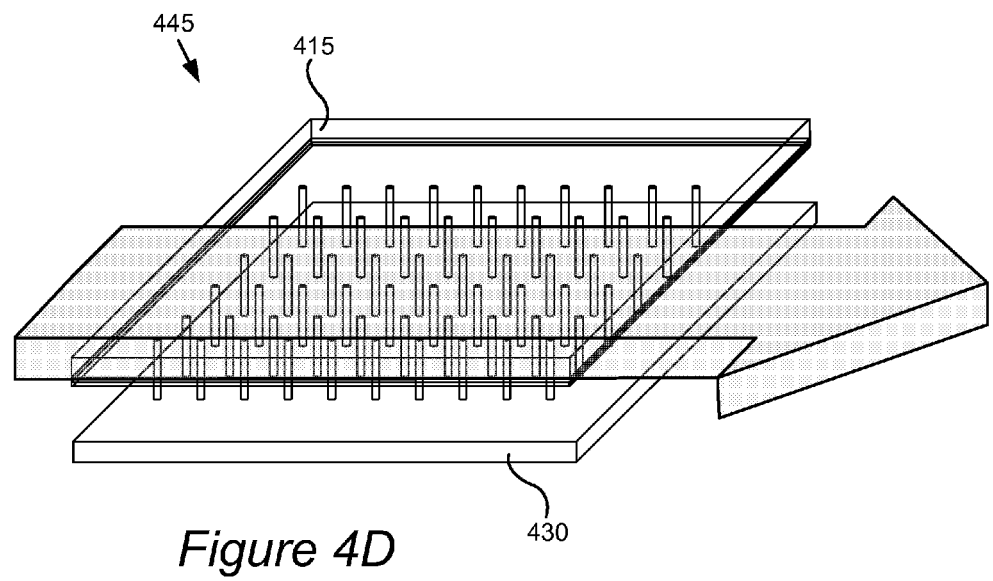
FIGS. 4D and 4E depict perspectives of components of electrodeposition apparatus in accord with embodiments of the invention.

Contact pin configurations as described herein can be used for static bath deposition equipment or for equipment in which the electrolyte is flowing through the equipment. For example, FIG. 4A depicts a static type bath, for example, for batch electrodeposition. FIGS. 4C and 4D depict apparatus that employ electrolyte flow between the electrodes during electrodeposition. By flowing the electrolyte during electrodeposition, higher-current depositions are possible because electrolyte depletion effects are minimized. That is, the depleted electrolyte is continuously replenished from the flow. Referring to the example in FIG. 4C, an electrodeposition apparatus, 445, which has similar features as apparatus 400, has an electrolyte chamber with one or more flow inlets, 446, and flow outlets, 447, for producing, in this example, a laminar flow (as depicted by the dashed arrow) of electrolyte 410. FIG. 4D is a perspective showing generally a laminar flow (as depicted by the heavy arrow) between the electrodes during deposition. In some embodiments, substantially laminer flow is provided, while there is also some cross flow between the electrodes, for example, when a support structure that includes the contact pins is used in between the electrodes during plating. This is explained in more detail below.

The apparatus described, for example in relation to FIGS. 4A and 4C, are depicted as having pins that pass through apertures in a counter electrode. Meant to be included in the scope of the invention are embodiments where the contact pins are slidably engaged with the counter electrode, or not. That is, apparatus may include components for engaging the pins with the substrate (working electrode) via moving the substrate to the pins and/or moving the pins to the substrate. The distance between the working electrode and the counter electrode, or "plating distance" can be an important parameter in some plating applications. In some embodiments, the plating distance is managed by one or more methods including moving the counter electrode and/or substrate. Apparatus described herein include positioning mechanisms associated with at least one of the working electrode, the counter electrode, the contact pins and support structure for the contact pins.

Figure 4E:
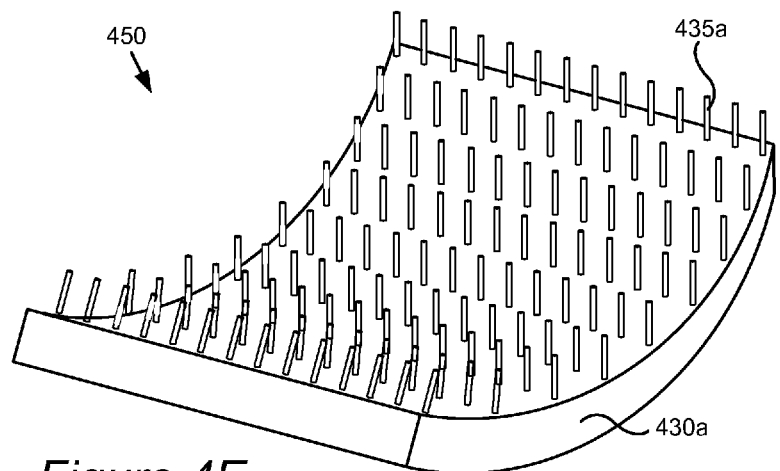

The substrate need not be planar or substantially flat, it can be curved. In the event plating is to be performed on a curved substrate, for example a cylinder, the counter electrode and contact pins are configured appropriately to carry out methods described herein. FIG. 4E depicts a component, 450, of an electrodeposition apparatus that has a curved counter electrode, 430a, through which (in accord with the description in relation to flat counter electrode 430, for example, in FIG. 4B) contact pins 435a protrude. In other embodiments, where the contact pins do not pass through a counter electrode, but rather a support structure is used to hold the contact pins against the substrate, the counter electrode may or may not be curved, while the support structure would support the contact pins in a format to match the substrate's topography when engaged with the substrate. Thus, one embodiment is an apparatus configured to carry out methods described herein on a curved substrate. Such apparatus can electrodeposit on a curved substrate such as a cylinder or curved plane. Another embodiment is a method as described herein carried out on a curved substrate.

In laminar flow regimes, for example as described in relation to FIG. 4D, since the contact pins have volume, it is possible that the contact pins can create a shadowing effect. That is, due to the contact pin's leading side or edge interaction with a substantially unidirectional laminar flow of electrolyte, an area adjacent to the contact pin and opposite the side of the pin that encounters the electrolyte first, there can be a differential fluid pressure at that area adjacent to the pin and this can create a localized different deposition rate than that on the rest of the substrate. If the contact pins have a small enough average diameter, then these effects can be minimized or made insignificant. Also, the cross-section of the pins can be made more aerodynamic so that there is substantially laminar flow around the entire pin (rather than laminar flow at the leading edge or side and turbulent flow at the opposite edge or side). Also, this shadowing effect can be overcome by flowing the electrolyte in a turbulent fashion, where the parameters of the electrolyte and the process permit operation in the turbulent flow regime. The shadowing effect may also be overcome by using an impinging flow of electrolyte, described in more detail below.

Thus, one embodiment is an apparatus as described herein configured to flow an electrolyte between the substrate surface and the counter electrode in a substantially laminar flow. Another embodiment is an apparatus as described herein configured to flow an electrolyte between the substrate surface and the counter electrode in a turbulent fashion. In one embodiment, the counter electrode includes apertures through which electrolyte flows normally to (impinges) the surface of the counter electrode and encounters the substrate surface normally, for example, a shower head type counter electrode. That is, for uniform deposition on the substrate, the counter electrode need not have a continuous surface, for example, the apertures for the contact pins do not prevent uniform deposition on the substrate and therefore additional apertures can be included for electrolyte flow as described. In one embodiment, electrolyte is flowed through a gap between the contact pins and the apertures in the counter electrode through which the pins pass. In one embodiment, both are used to flow electrolyte through the counter electrode and onto the substrate. Curved counter electrodes such as depicted in FIG. 4E may have apertures for flowing electrolyte through the counter electrode and onto the working electrode. One embodiment is a curved counter electrode with apertures for flowing electrolyte therethrough. Such counter electrodes can be used in combination with contact pins that pass through the counter electrode or those held by a support structure. In the former embodiment, the contact pins may pass through the same apertures as the electrolyte flows through and/or have their own apertures to pass through, whether or not electrolyte also flows through the pin apertures.

Figure 4F:
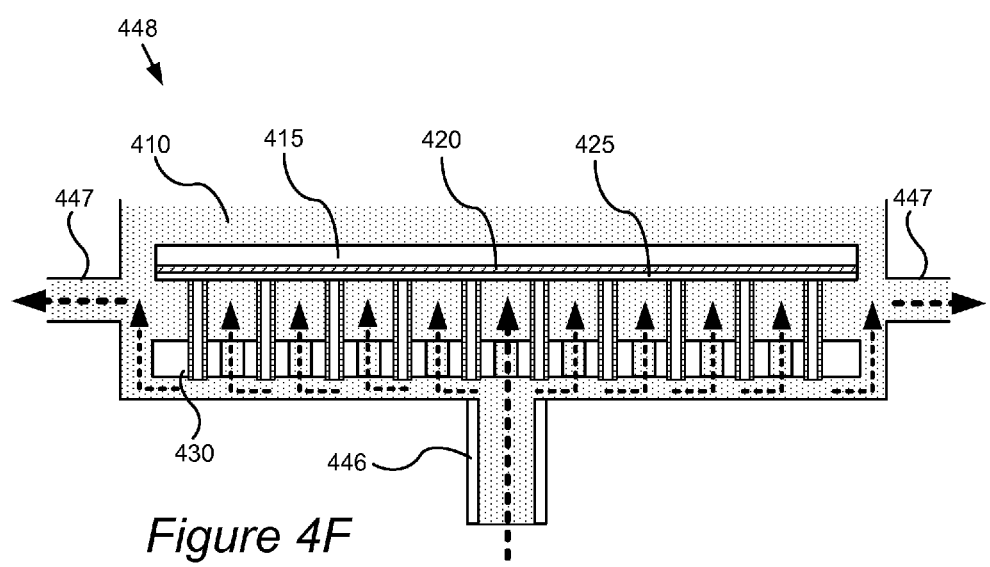
FIG. 4F depicts a cross section of components of electrodeposition apparatus in accord with embodiments of the invention.

FIG. 4F is a cross section of an apparatus, 448, similar to that depicted in FIG. 4C, except the counter electrode, 430, has a number of apertures that allow flow of electrolyte through the counter electrode, via inlet 446, normal to the surface of the working electrode. The electrolyte impinges on the working electrode where electrodeposition takes place, and the used electrolyte passes out of the electrodeposition chamber via outlets 447. Electrical connection to the contact pins is not shown in this Figure. One embodiment, is an electrodeposition apparatus that includes a counter electrode with apertures for electrolyte flow as well as contact pins that pass therethrough, in combination with contact pins held by a support structure as described herein.

Other apparatus for performing electrodeposition will typically include a mechanism for placing the substrate in the appropriate location and for engaging the substrate with the contact pins. Electrodeposition can be commenced once the pins make suitable electrical contact with the substrate and the electrolyte is present. The composition of the electrolyte depends on the material to be deposited. Examples of electroplating solutions that can be used for fabricating different layers of CdTe solar cells are described above.

In certain embodiments, apparatus do not have counter electrodes with apertures through which the contact pins pass in order to make contact with the working electrode (although they may include electrolyte flow apertures). Rather, certain such apparatus have a support structure for holding the contact pins, where the support structure may at least partially lie between the counter electrode and the working electrode during electrodeposition and is used to hold the pins against the substrate (as described above, one embodiment is an electrodeposition apparatus having contact pins both passing through a counter electrode and held by a support structure). One embodiment is an apparatus for electrodeposition including a support structure, the support structure including a plurality of contact pins, each contact pin of said plurality of contact pins configured to establish electrical contact with a substrate surface and thereby supply plating potential to the substrate, the support structure disposed between the substrate surface and the counter electrode during electrodeposition.

Figure 4G:
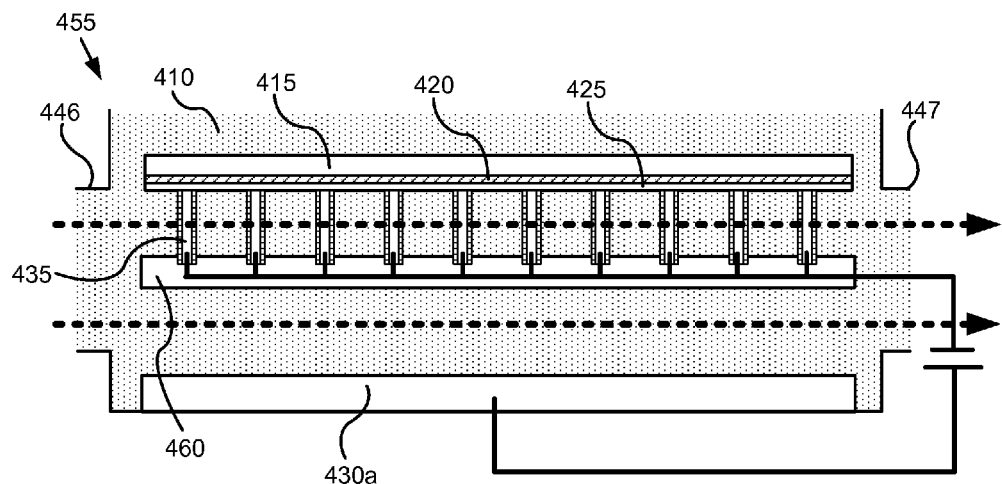
FIGS. 4G and 4H depict cross sections of components of electrodeposition apparatus in accord with embodiments of the invention.

The support structure may further include a mechanism for moving the pins toward and/or away from the substrate. The support structure may be coated with chemically resistant and/or insulating coating to prevent contamination of the electrolyte and chemical degradation of the support structure due to the electrolyte. In this embodiment, the contact pins may have flex so that the substrate, although contacting the pins, can be moved toward or away from the counter electrode. In one embodiment, the contact pins are rigid but have spring mechanisms so that they can retract or be pushed into the support structure in order to keep tension between the substrate and the contact pins and/or vary the distance between the substrate and the counter electrode FIG. 4G depicts a cross section of an electrodeposition apparatus, 455, which is similar to that described in relation to FIG. 4C. In this apparatus however, the counter electrode, 430*a*, does not have apertures for passing the contact pins through (although a counter electrode may have apertures, for example for electrolyte flow, or other features as one of ordinary skill in the art would understand, these embodiments are not limited to any particular counter electrode configuration). Apparatus 455 includes a support structure, 460, which supports contact pins 435 (as described herein). The remaining reference numbers in FIG. 4G are the same as described in relation to FIG. 4C. In this example, electrolyte flows (from left to right as drawn) between the counter electrode and the support structure, and between the working electrode and the support structure as indicated by the heavy dotted arrows. Contact pins 435 supply electrical charge to CdS film, 425, as described herein. Support structure 460 includes the contact pins and wiring to the pins. Support structure 460 may also include further components such as circuitry for the plating system, for example, resistors for the contact pins as described herein. In this example, support structure 460 has a planar body with no apertures to allow electrolyte to pass therethrough. The support can be made of, for example, a metal coated with a polymeric protecting layer, such as plastic like parylene or another electrically insulating and chemically resistant material described, for example, those materials described in relation to the coatings for contact pins herein. In one example, the support structure is a circuit board coated with such materials.

As described in relation to FIGS. 4C and 4D, apparatus that employ electrolyte flow between the electrodes during electrodeposition allow for higher-current depositions because electrolyte depletion effects are minimized. In this example, electrolyte flows between the counter electrode and the support structure, and between the working electrode and the support structure. The electrolyte composition and flow parameters may be sufficient to allow uniform electrodeposition, even at high-current depositions. However, the support structure may have apertures to allow electrolyte to flow through it as well.

Figure 4H:
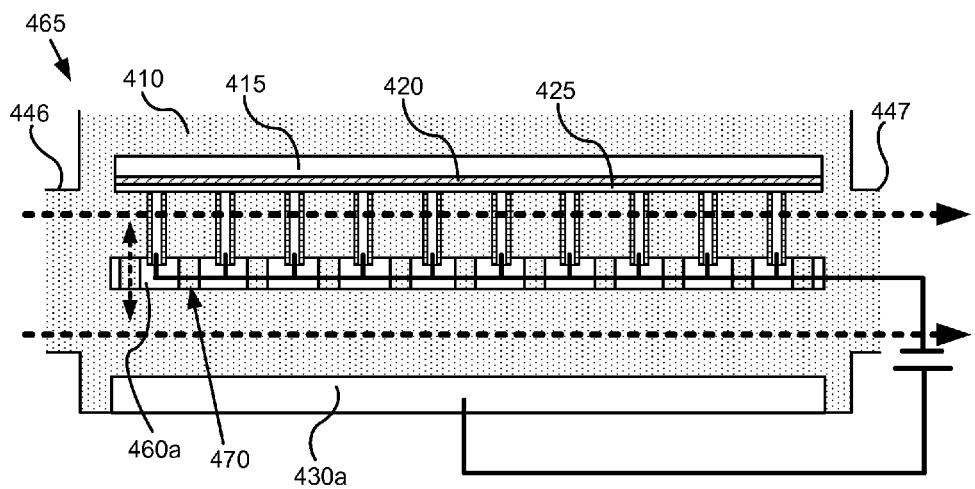

FIG. 4H depicts a cross section of an electrodeposition apparatus, 465, which is analogous to apparatus 455, but in this example the support structure, 460*a*, has apertures, 470, through which electrolyte can traverse during plating. This electrolyte flow is depicted by the vertical double-headed dashed arrow in FIG. 4H. By allowing flow through the support structure, ion transport is aided as well as electric field.

Although FIGS. 4C-D and 4G-H depict what appears to be electrolyte flow along a horizontal plane, the invention is not so limited. Apparatus described herein can be oriented and configured to operate at an angle to the horizontal. For example, in one embodiment, apparatus described herein are configured in a vertical orientation, for example, where the electrolyte flows from an entry port at one end of the plating cell, through the deposition cell, and through an outlet at the bottom of the apparatus. Similarly, although FIG. 4F appears to depict electrolyte flow vertically from the bottom of a deposition cell to the surface of the substrate and then deflected radially outward, in certain embodiments, the apparatus is in fact in a vertical orientation, where electrolyte flows horizontally to impinge on the working electrode and then flows, for example, radially outward along the surface of the substrate to one or more exit ports.

Figure 4I:
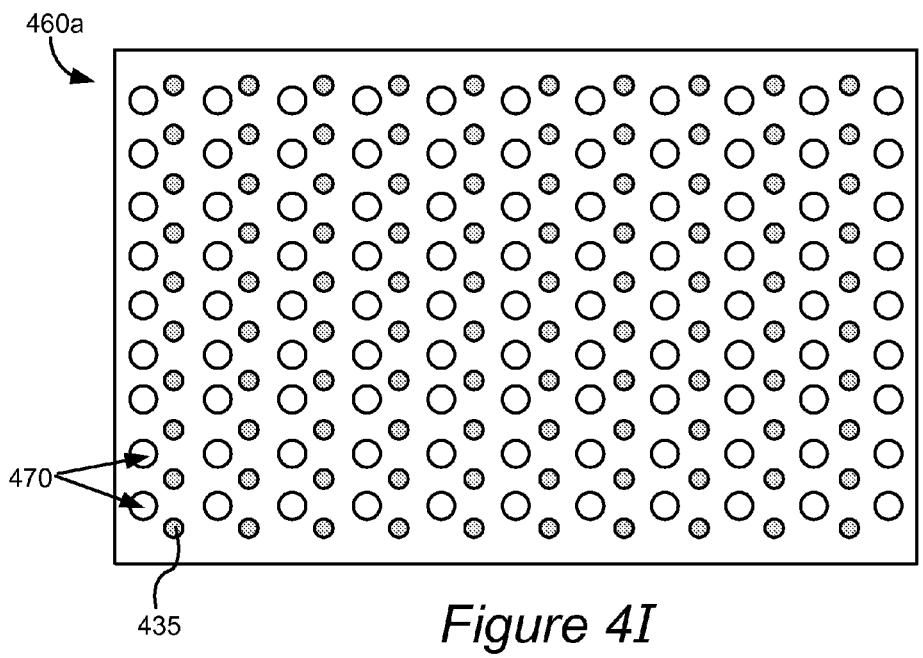
FIGS. 4I and 4J depict top views of support structures of electrodeposition apparatus in accord with embodiments of the invention.
Figure 4J:
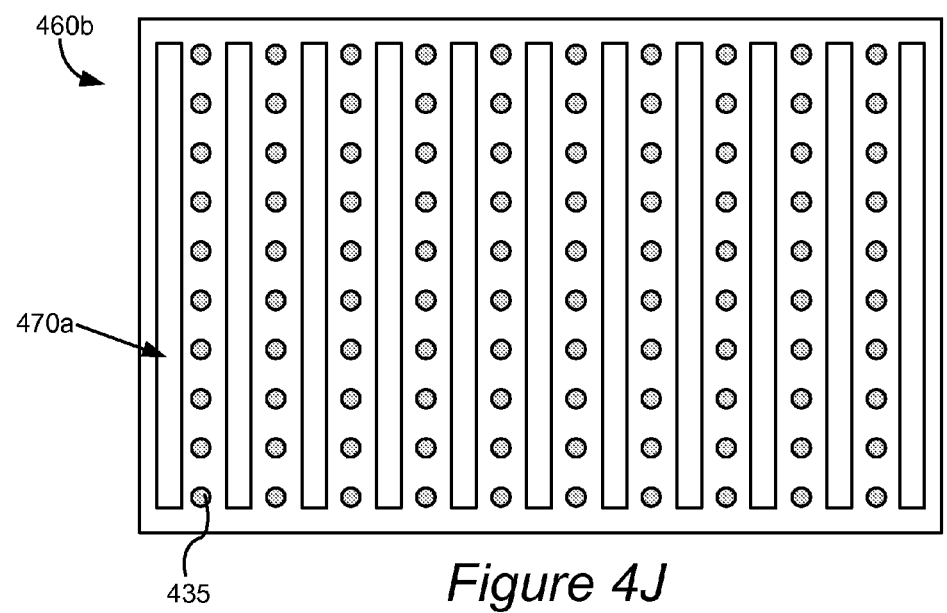
Figure 4K:
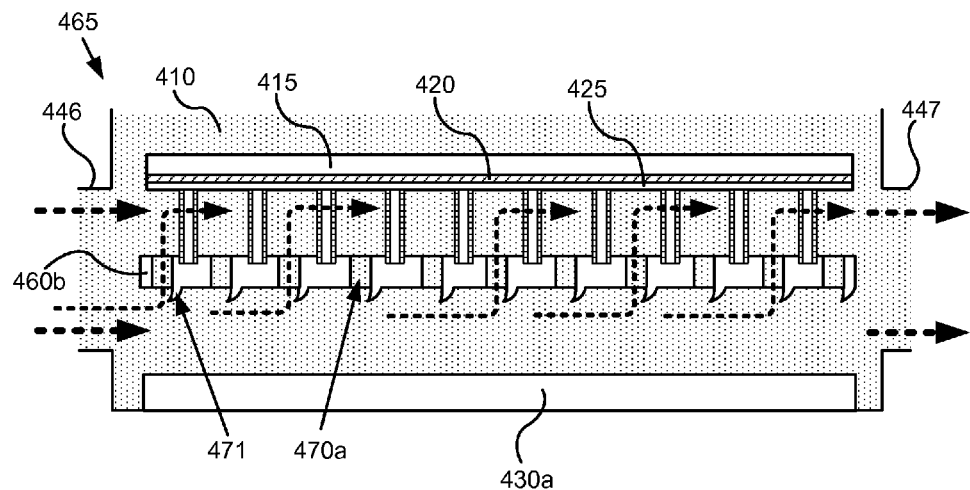
FIGS. 4K and 4L depict cross sections of components of electrodeposition apparatus in accord with embodiments of the invention.

FIG. 4I depicts support structure 460*a* from a top view. In this example, rows of apertures 470 are included to allow efficient electrolyte flow through the support structure. FIG. 4J depicts a top view of another support structure, 460*b*, having apertures, 470*a*, which are channels formed so that they are oriented perpendicular to the electrolyte flow during plating. FIG. 4K depicts a cross section of an electrodeposition apparatus, 465, which employs support structure

Figure 4L:
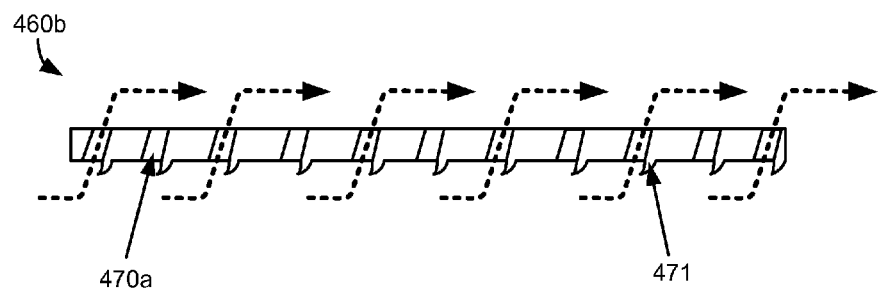
Figure 4M:
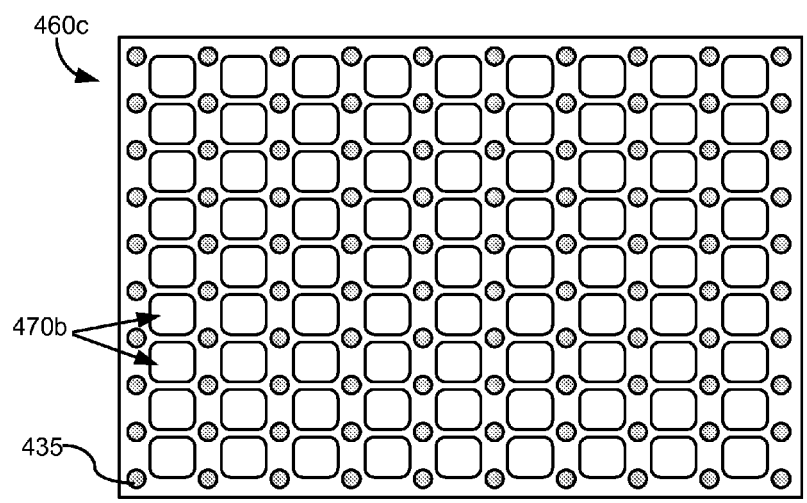
FIGS. 4M and 4N depict top views of support structures of electrodeposition apparatus in accord with embodiments of the invention.

470*a*. In this example, support structure 460*b* includes protrusions, 471, on its bottom (as drawn) surface. Protrusions 471 may be continuous along the length of channels 470*a*, or not. In this example, protrusions 471 are configured to deflect electrolyte flow from the underside of support plate 460*b* and direct it through channels 470*a* and toward the surface of the working electrode as indicated by the curved dotted arrows. FIG. 4L illustrates in cross section, in support plate 460*b*, that the apertures may be angled to aid flow therethrough. The protrusions may be configured to aid flow through the support plate towards and/or away from the working electrode, depending upon the particular electrodeposition desired. In some embodiments, the flow through the support structure may need to be maximized and therefore the footprint of the support structure may need to be minimized. Apertures through the support structure can be made as large as possible, for example, as shown in FIG. 4M. In this example, support structure 460*c* has a number of large apertures, 470*b*.

Figure 4N:
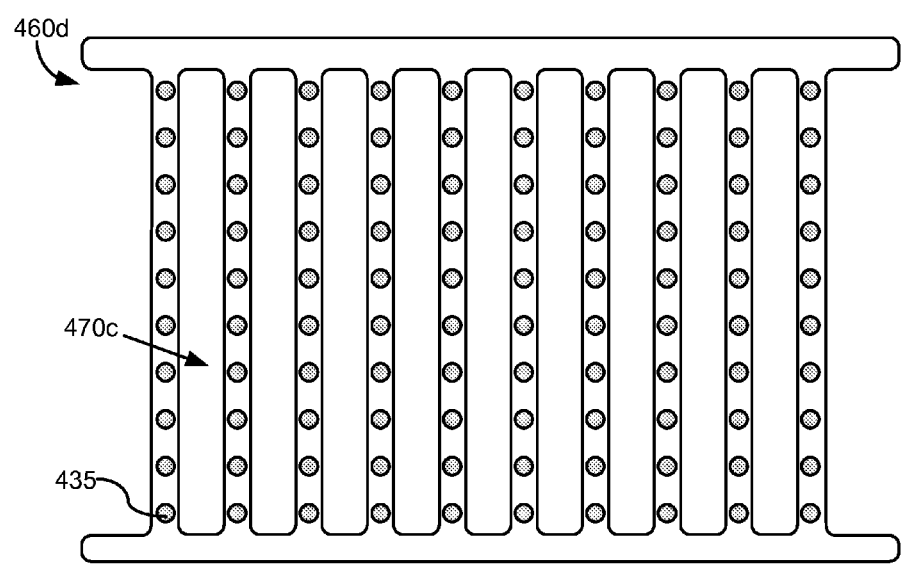

As the apertures are made to represent a larger proportion of the area of the support structure's surface, the support structure begins to resemble a screen or sieve. Such a structure may be characterized as having a "frame" which supports interior support rods bearing the contact pins. In one embodiment, the support structure includes a plurality of rods, each supporting a number of contact pins, the plurality of rods supported by a frame. In this way, electrolyte flow through the support structure is maximized since there is very little surface area to the support structure. FIG. 4N depicts a top view of an exemplary support structure, 460*d*, which has rods supporting contact pins 435. When the rods are arranged as depicted, large apertures, 470*c*, allow electrolyte to flow freely through the support structure. "Rods" in this context may have any cross section, for example, circular, rectangular, oval, triangular, etc. In one embodiment, the rods are shaped like a fin or wing. In one embodiment, the shape of the rods is configured to guide an electrolyte flow, running parallel to the surface of the substrate and counter electrode, so that electrolyte is guided above and/or below the support structure. In another embodiment, the shape of the rods is configured to guide an electrolyte flow, running perpendicular to the substrate surface, for example impinging on the substrate surface, to particular areas of the substrate, for example, to compensate for flow patterns derived from the electrolyte flow interacting with the contact pins and surface of the substrate. For example, the rods may be shaped like blades or fins to concentrate flow in some areas while lessening flow that impinges on other areas of the substrate.

In one embodiment, a showerhead type counter electrode, for example as depicted in FIG. 4F is used in combination with a support structure having a plurality of apertures as described herein. In one embodiment, the counter electrode has one or only a few (larger) apertures through which electrolyte can flow, and the support structure's apertures act as a diffuser to create a uniform flow of the electrolyte that impinges on the working electrode in order to electrodeposit in a uniform fashion. In one embodiment, the rods have flex and are supported by a rigid frame or partial frame, for example a U-shaped open frame or, for example, one or more individual supports for the rods (for example see FIGS. 5A and 5B which describe similar supports, 560, for pins). The flex in the rods allows for some flexure of the contact pins when engaged with the working electrode. This is analogous to a window screen, where the frame is rigid, but the screen can flex. In this embodiment, the contact pins may also have some flexibility or may be rigid. All or part of the frame of the support structure may or may not reside between the working electrode and the counter electrode during plating. In one embodiment, the frame does not reside between the substrate and the counter electrode during plating; the rods are sufficiently long that they span the working surface dimension(s) of the electrodes. Thus the frame may be larger to accommodate circuitry, for example resistors, the ends of the support rods and the like, while the dimensions of the rods bearing the pins (and wiring to the pins) can be minimized. In one embodiment, whether the electrolyte passes through the support structure or not, the support structure supports the pins on a thin flexible member supported by one or more spring mechanisms, for example, a flexible body between the flexible member and a rigid base. When the pins engage the substrate, both the thin flexible member and the flexible body give, but by virtue of their configuration maintain pressure on the pins against the substrate.

Figure 5A:
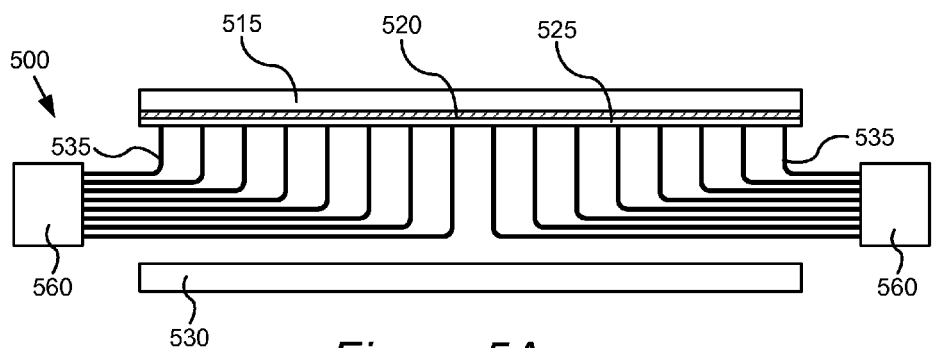
FIGS. 5A-D depict cross-sections and top views of exemplary support structures.
Figure 5B:
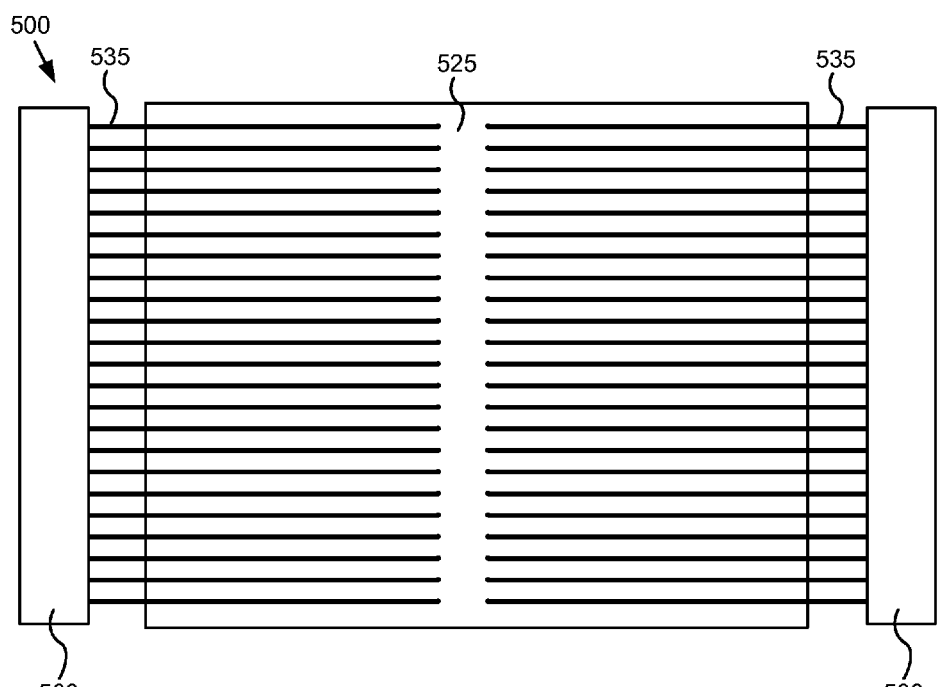

As mentioned above, the support structure can reside entirely outside the counter and the working electrodes and the pins can be constructed such that they are brought into the space between the counter and the working electrode (without passing through the counter electrode) and make contact with the working electrode without that portion of the support structure holding the contact pins residing between the two electrodes. FIGS. 5A and 5B describe an example of such a support structure. Referring to FIG. 5A, support structure, 500, includes pin holders, 560, for supporting a plurality of pins, 535. In this example, there are two pin holders 560 included in support structure 500. Pins 535 are generally L-shaped, and, in this example, have varying lengths. The L-shaped pins have a portion of the pin that traverses a span substantially parallel to the face of the electrodes (counter electrode 530 and working electrode (in this example, substrate 515, TCO 520 and CdS film 525)) and a portion that is substantially perpendicular to the face of the electrodes, the latter portion including the end of the pin that makes physical contact with the face of the working electrode during electrodeposition. In this example, pins 535 have varying length and are configured so as not to make contact with each other while being spaced appropriately at their contact points on the working electrode. Preferably, pins 535 are constructed of materials as described herein, however, one of ordinary skill in the art would recognize that other materials, either currently available or developed hereafter, would be suitable for fabrication of pins 535. For example, pins 535 can be made of a relative rigid material, while in combination with the shapes and dimensions described, provide flexibility so the pins can be compressively engaged with the working electrode. In this example, if resistors are used with pins 535, the resistors can be housed in pin holders 560 or, for example, be integral to the pins themselves. In one embodiment, the resistors are wired with and configured within the contact pin structure. In another embodiment, the resistors are wired with and configured outside, but on, the contact pin structure. In this latter embodiment, the contact pin, resistor (e.g. bound or adhered to the pin) and associated wiring, are coated with a corrosion resistant material as described herein.

FIG. 5B depicts a top view (as from the perspective of the counter electrode looking toward the working electrode) which shows that there are rows of pins 535, in this example, on each pin holder there are 23 rows of pins, each row having 8 pins, for a total of 184 pins on each pin holder 560. Therefore this particular support structure has 368 pins. Pin number and pin density ranges described herein apply to the embodiments described in relation to FIGS. 5A-D.

Figure 5C:
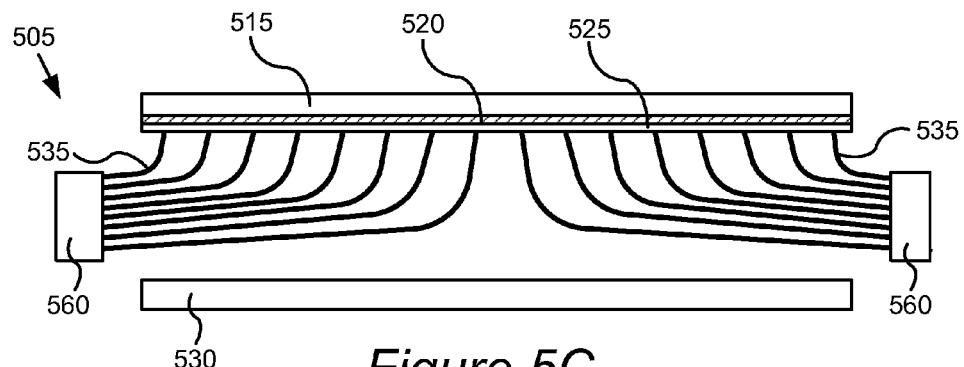

As described in relation to FIG. 4N, pins 535 may be held by only a single pin holder, 560, which may take the form of a single linear structure as in FIG. 5B, or a four-sided frame or, for example, a U-shaped structure. Pins 535 may also be held by two, three or four pin holders 560, depending on the application. For example, FIG. 5C depicts a cross section of a support structure, 505, similar to that depicted in FIG. 5A (working electrode and counter electrode also depicted). In this example, pins 535 are curved, for example, there may or may not be a portion of each pin that is either perpendicular or parallel to the electrode work surface.

Figure 5D:
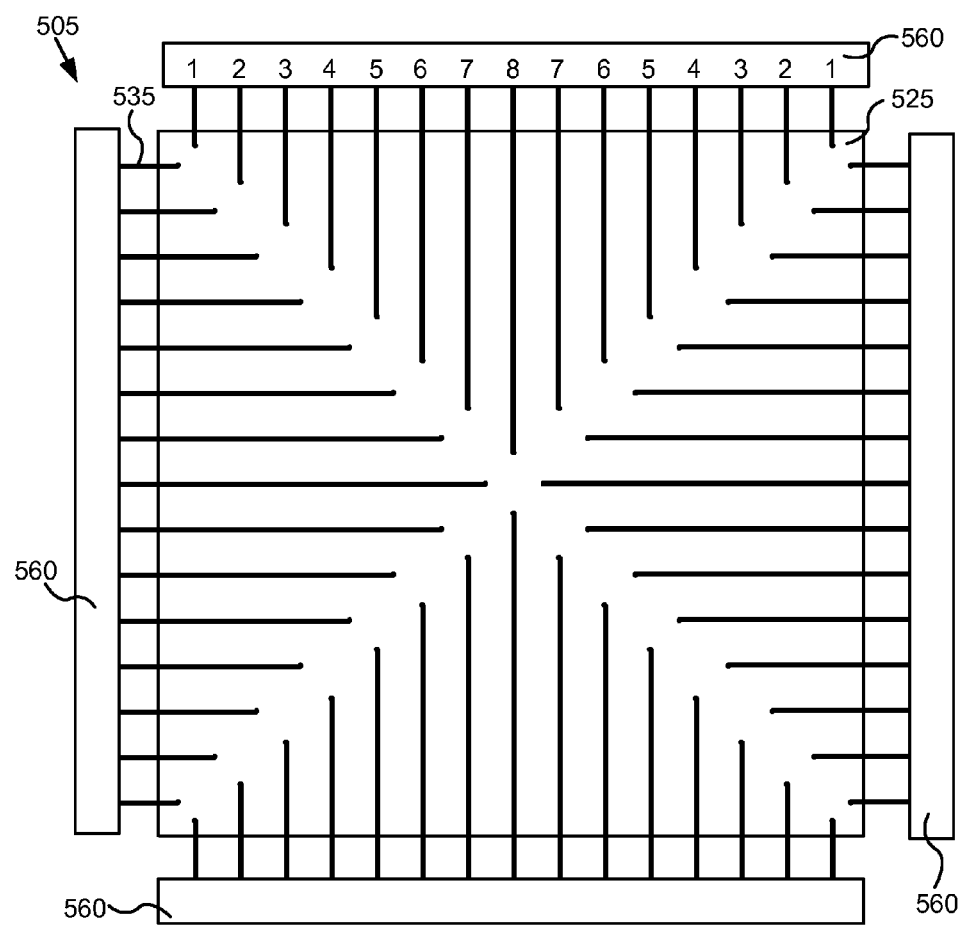

FIG. 5D shows a view from the perspective of the counter electrode looking toward the working electrode. In this example there are four pin holders 560 (for clarity, and because it is a cross-section) two of them were not depicted in FIG. 5C). Each pin holder 560 holds 64 pins, as depicted on the topmost pin holder 560 in FIG. 5D, the rows of pins include 1, 2, 3, 4, 5, 6, 7, 8, 7, 6, 5, 4, 3, 2 and 1 pins, respectively. Since there are four pin holders, in this example, support structure 505 includes 256 pins. In embodiments where the support structure includes a positioning mechanism, one or more of pin holders 560 may be movable in along one or more vectors. For example the pin holders may be moved into position, each along a path parallel to the working electrode moving from a point outside the perimeter of the electrode toward a point inside the perimeter of the working electrode. The pin holders may also travel at any angle in a plane parallel to the working electrodes, for example the pin holders can be rotated about an axis perpendicular to the working electrode in order to position the pins over the working electrode (an analogously remove them from the position), for example, as in a camera iris closing or opening. In another example, the pin holders are brought into position (as depicted in FIG. 5D), or removed therefrom, at 45 degree angles relative to the edges of the working electrode. The pin holders may also move along a path perpendicular to the working electrode to engage the pins with the working electrode. As the substrate and/or the counter electrode may also be moved via a positioning mechanism, and thus the distance between the working and counter electrode may be varied greatly, the pin holders may also move along vectors that are neither perpendicular or parallel to the electrodes. For example the positioning mechanism may move the pin holders along a vector that is at an acute angle to the working electrode surface and/or rotate about an axis in order to "swing" the pins into engagement with the working electrode. One of ordinary skill in the art would appreciate that any number of movements are possible without escaping the scope of the invention and that various combinations of these movements are contemplated.

So as not to overly complicate the representations, FIGS. 5A-D do not show electrolyte baths, electrolyte flow dynamics or, for example, circuits and/or resistors as in other figures. One of ordinary skill in the art would appreciate that these features are meant to be included in a functioning electrodeposition system. More to the point, one embodiment is an electrodeposition apparatus including one or more features of a support structure as described in relation to FIGS. 5A-D, and including any features of circuits, flow parameters, and the like from the other figures herein. For example, the support structures described in relation to FIGS. 5A-D are well suited for apparatus that include, for example, showerhead type counter electrodes that produce even impinging flow of electrolyte on the working electrode during electrodeposition, although other electrolyte flow patterns are contemplated. In another example, one of ordinary skill in the art would appreciate that the support structures described in relation to FIGS. 5A-D are suited for use on curved substrates, due to, at least in part, the flexibility of the contact pins. One embodiment is a support structure as described in relation to FIGS. 5A-D, configured for use on a curved substrate.

One of ordinary skill in the art would understand that various combinations of the features described in relation to FIGS. 4G-M and 5A-D are possible. One embodiment is a support structure having one or more of the features described in relation to FIGS. 4G-M and 5A-D. One embodiment is an apparatus having the support structure as described herein, with any of the pin contact and/or control features described herein.

FIGS. 4A-N and 5A-D are simplified illustrations of electrodeposition apparatus embodiments. Other components of the equipment, such as electronics for control systems, for applying potentials to the electrodes, chemical handling systems for the electrolyte etc., are not depicted, so as to simplify the discussion. The dimensions of the different components of the system can vary across a large range depending on the application for which the equipment is intended without escaping the scope of the invention. For example, although some of the support structures described are depicted as approximating the area of the counter electrode and working electrode, in one embodiment the supporting structure has, for example, two, three, four or more times the area of the working electrode so that more than one electrodeposition may take place simultaneously on two, three or four substrates, using corresponding counter electrodes or a single large counter electrode.

The contact pins described herein supply plating potential to the working electrode and therefore occupy physical space between the counter electrode and the working electrode. As such, they can effect the electric field between the electrodes. This is also true of the support structures described herein. Generally, the negative implications of this fact are negated because the contact pins are used to normalize the plating current across the substrate surface. However, there may be instances where additional control is needed via field shaping in the space between the working and counter electrodes. In one embodiment, the contact pins and/or the support structure is also configured as a field shaping element in order to achieve uniform electrodeposition. For example, the support structure may be made of polymeric material and shaped to tailor the electric field, for example, near the center, edges or both center and edges of the substrate.

The electrodeposition apparatus may also include a controller system for managing the different components of the system. By way of example, the controller may be configured or programmed to select the potential difference that is applied between the substrate and the electrode, control electrolytic flow rate and fluid management, control movement mechanisms, register contact pins with a counter electrode, verify connectivity of contact pins with the substrate, apply voltages to individual pins, and the like. Any suitable hardware and/or software may be utilized to implement the controller system. For example, the controller system may include one or more microcontrollers and microprocessors such as programmable devices (for example, complex programmable logic devices (CPLD's) and field programmable gate arrays (FPGA's) and unprogrammable devices such as gate array application specific integrated circuits (ASIC's) or general-purpose microprocessors, computer and/or memory configured to store data, program instructions for the general-purpose processing operations and/or the methods described herein.

Another embodiment is a method of electrodeposition, including: (a) establishing a plurality of ohmic contacts through a substrate film to an underlying electrically conductive film using a plurality of contact pins, the plurality of contact pins electrically isolated from a counter electrode; and (b) electrodepositing a material from an electrolyte onto the substrate film. As described above, methods of the invention find particular use where the substrate film has limited conductivity and thus an instrinsic sheet resistance, especially where deposition is to be performed on substrates having large areas. By establishing a plurality of ohmic contacts to an underlying conductive layer, higher plating currents can be used while addressing potential drops across large plating areas. In the scenario where the underlying electrically conductive layer is, for example, a relatively thin transparent conducting oxide, its sheet resistance is addressed via the ohmic contacts through the substrate layer and thus higher plating currents can be used without large potential drops across the transparent conductive oxide.

"Substrate film" means a film or layer that is part, or will be a part, of an electronic device, such as a photovoltaic device. In one embodiment, a substrate film has a thickness of between about 0.01 µm and about 10 µm, in another embodiment between about 0.03 µm and about 5 µm, in another embodiment between about 0.03 µm and about 0.3 µm, and in another embodiment between about 0.1 µm and about 0.3 µm. For example, CdS can be the substrate film. Under, and adjoining the substrate film is an electrically conductive layer to which ohmic contacts are made through the substrate film. The electrically conductive layer has an inherent sheet resistance that is compensated for during electrodeposition methods of the invention so that higher plating currents can be used without sacrificing uniformity (which would result if potential is applied only via the periphery of the electrically conductive layer as in conventional methods). In one embodiment, the electrically conductive layer has a sheet resistance of between about 1 ohm per square and about 30 ohms per square, in another embodiment between about 2 ohms per square and about 20 ohms per square, in another embodiment between about 5 ohms per square and about 15 ohms per square.

Using higher plating currents allows for faster electrodepositions, while the contact pins described herein allow deposited film uniformity to be maintained across large area substrates. In one embodiment, apparatus described herein are configured to electrodeposit on a substrate between about 1 meter by about 2 meters, for example a substrate 1.1 meter by 1.4 meters. In one embodiment, apparatus described herein are configured to electrodeposit on a substrate between about 1 meter by about 3 meters, for example a substrate 1.1 meter by 2.5 meters. In another embodiment, apparatus described herein are configured to electrodeposit on a substrate between about 2 meters by about 4 meters or larger.

In one embodiment, the electrodeposition is performed at a rate of between about 0.01 µm/minute and about 1 µm/minute, with a uniformity of between about 1% and about 25% of the average film thickness. In one embodiment, the electrodeposition is performed at a rate of between about 0.05 µm/minute and about 0.5 µm/minute, with a uniformity of between about 5% and about 20% of the average film thickness. In one embodiment, the electrodeposition is performed at a rate of between about 0.1 µm/minute and about 0.3 µm/minute, with a uniformity of between about 5% and about 10% of the average film thickness. In one embodiment, the electrodeposition is performed at a rate of about 0.2 µm/minute, with a uniformity of about 10% of the average film thickness.

Figure 6:
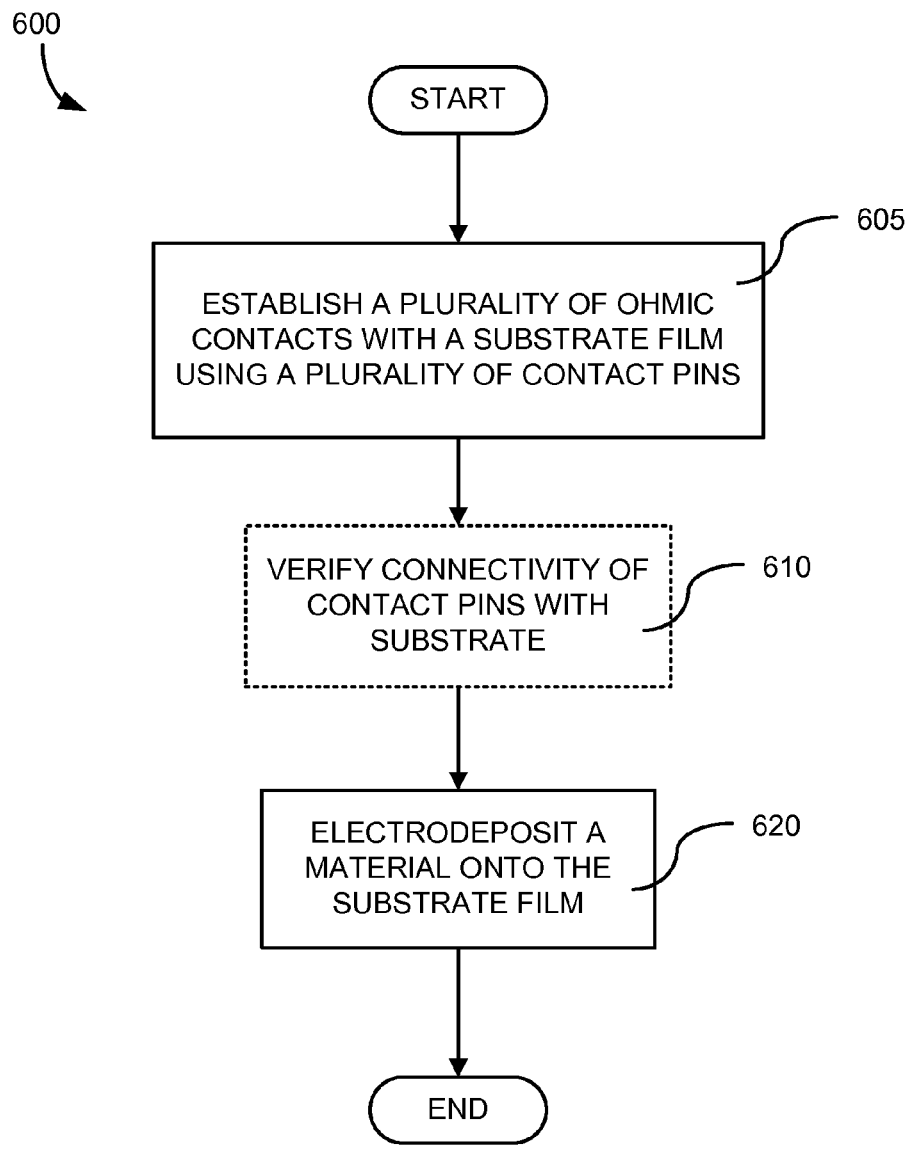
FIG. 6 depicts a process flow according to methods in accord with embodiments of the invention.

FIG. 6 depicts a process flow, 600, outlining aspects of a method for electrodeposition in accord with embodiments of the invention. First, a plurality of ohmic contacts are established through a substrate to an underlying electrically conductive layer using a plurality of contact pins, see 605. Optionally, the connectivity of the contact pins is confirmed prior to plating, see 610. Verification of pin connectivity (electrical communication with the conductive layer via the substrate film) can be achieved by configuring the contact pins as individually addressable, for example, by using a switching matrix. This connectivity check helps to ensure that uniform deposition is achieved across the substrate. Then a material is electrodeposited onto the substrate film, see 615. Then the method is complete. An example would be depositing CdTe on a CdS substrate film, for example CdS/TCO/glass substrate as described above. In one embodiment, the voltage applied to each contact pin may vary according to pre-set and/or feedback algorithms in a controller that apply voltage to individual contact pins based on the needs of the deposition in order to achieve uniform deposition of the desired material film. For example, for depositing CdTe films on a CdS/TCO/glass substrate using potentiostatic deposition, a potential of between about −200 mV and about −600 mV with respect to a silver/silver chloride (Ag/AgCl) reference electrode can be used. Also, methodologies that adjust the potential during the deposition, such as methods based on Quasi Rest Potential (QRP), can also be used. In QRP based methodology, a potential is applied for deposition and the current is periodically interrupted to measure the resistive drop from which the QRP is determined. In such methods, the potential is adjusted to maintain a constant QRP during the deposition. For example, for CdTe depositions using this methodology, QRP values from between about −300 mV and about −600 mV with respect to a Ag/AgCl reference electrode can be used.

In one embodiment, establishing the plurality of ohmic contacts includes at least one of using contact pins, of the plurality of contact pins, that include a contact area which comes in contact with the substrate film, the contact area including a conductor capable of establishing ohmic contact with the substrate film at or about the plating voltage. For example, if the substrate film includes CdS, then a conductor that would allow ohmic contact within the plating voltage regime is indium. Thus in one embodiment, the contact pins are coated with and/or include indium at least in their contact area, that is, where they adjoin the substrate film upon engagement with the substrate film. Other conductors that allow such ohmic contact include, but are not limited to, aluminum, gallium, and zinc. One potential drawback of this method is the cost of the conductor as described above. For example, indium is relatively expensive. However, in the example of a CdS substrate film, the amount of indium needed is relatively small, as only the contact area of the pins need contain indium, and the contact pins typically have a small cross-section and/or tip configuration.

One embodiment is a method of electrodeposition, including: (a) establishing a plurality of ohmic contacts with a TCO via a CdS film using a plurality of contact pins, the plurality of contact pins electrically isolated from a counter electrode; and (b) electrodepositing a material from an electrolyte onto the CdS film; where (a) includes at least one of using contact pins coated with indium at least at the contact point and applying a breakdown voltage to each of the plurality of contact pins. The breakdown voltage is that which is appropriate to form the ohmic contacts with the TCO. In one embodiment the electrodeposited material includes cadmium telluride.

It can be beneficial if the material for the contact pins is not constrained by requiring establishing an ohmic contact with an underlying electrically conductive layer via the substrate at or around the plating voltage. For example, for contacting CdS, the metals described above, for example indium, for forming the ohmic contacts at or around the plating voltage are typically expensive and/or not commercially available. However a large number of conductors, for example common metals, make ohmic contact with the materials commonly used, for example, in transparent conductive oxides which are under the substrate layer. In one embodiment, when electrodepositing on substrate films that have, for example, an underlying TCO, after engaging the contact pins with the substrate film, a breakdown voltage is applied to the contact pins to establish an ohmic contact to the underlying TCO. This can be done prior to introduction of electrolyte to the apparatus and/or after. That is, a breakdown voltage is applied to establish the ohmic contacts with the underlying layer rather than, for example, coating the contact pins with a material, for example indium, that allows establishment of the ohmic contacts at or near the plating potential.

"Breakdown voltage" is a term of art generally meaning the minimum voltage that causes a portion of an insulator to become electrically conductive. Substrate films, for example CdS and the like, have some conductivity, but also some inherent resistance. The breakdown voltage is the minimum voltage required to overcome the resistive component of the substrate film and allow electrical flow to the underlying conductive layer, for example, a TCO. The breakdown voltage, for example when CdS is the substrate film, is on the order of a few volts, when the CdS layer is on the order of a 1000 Å thick. This potential locally perturbs the CdS creating a conductive path to the TCO, creating an ohmic contact between the contact pins and the TCO. This embodiment makes a much wider choice of conductive materials available for the contact pins, at least for the portion configured to make contact with the substrate during deposition. In one embodiment, the breakdown voltage is high enough to breakdown the substrate film's resistance, but not so high as to reach the breakdown voltage of the underlying TCO. In one embodiment, the breakdown voltage is between about 0.5 volts and about 10 volts, in another embodiment between about 1 volt and about 5 volts, and in another embodiment the breakdown voltage is between about 2 volts and about 3 volts.

When the contact pins are engaged with the substrate film, and electrolyte is flowing, there is the possibility, depending on the materials and configuration of the contact pins and if they penetrate the substrate film, that the contact pins' position on the substrate film surface may change. That is, the electrolyte flow can physically displace the pin from its original position along the surface of the substrate film to a new position. Embodiments of the invention contemplate pin displacement from a first contact area to another contact area. Also, the breakdown voltage can change the physical characteristics of the substrate film where a portion of the substrate film in contact with the pin can be changed sufficiently so as to facilitate physical displacement of the pin's contact, for example, by the electrolyte flow. In one embodiment, a breakdown voltage is applied prior to electrolyte flow. In another embodiment, a breakdown voltage is applied after electrolyte flow. In yet another embodiment, a breakdown voltage is applied before and after electrolyte flow.

In a specific embodiment, where a breakdown voltage is applied to a CdS substrate film and deposition potential is not reached in the CdS film at the breakdown voltage, then the breakdown voltage is applied after electrolyte flow so that pin movement, for example due to the pins first encountering electrolyte flow, is irrelevant. That is, if there is little possibility of deposition at the breakdown voltage, then pin movement due to the breakdown voltage along with electrolyte flow is irrelevant, since pin movement due to these forces will have occurred prior to any deposition on the substrate film.

When the breakdown voltage is applied to make ohmic contact between the substrate and the pins, the total resistance in the circuit changes abruptly which can cause a large current to flow through the circuit. This large current can damage the CdS film. If resistors having resistance values larger than the resistance of the circuit when the pins make an ohmic contact with the substrate are placed in series in the circuit, damage due to a large abrupt current flow can be prevented. This is true because when the breakdown voltage is applied and the pins form an ohmic contact with the substrate the current flowing in the circuit will be limited by these resistors.

In another embodiment, illumination of the substrate can be used to lower its resistivity and thus aid in forming ohmic contacts. That is, since photovoltaic substrate films, for example CdS, are photoactive, then shining intense light on the substrate (layer on which deposition is to occur) lowers the resistance of the film and thus can lower the resistance to making ohmic contact, without need to apply a breakdown voltage. In one embodiment, the light source is integrated with the plating apparatus. In one embodiment, the light source is a bright white light source or a light source having specific wavelengths of between about 400 nm and about 900 nm. In one embodiment, blanket illumination of the substrate film is performed through the CdS/TCO/glass substrate with the light incident from the glass side (side opposite of where electrodeposition is to take place) of the substrate. The illumination is applied at the beginning of the deposition to lower the contact resistance to the CdS substrate and is terminated at or near the end of the deposition or after the deposition is complete.

In another embodiment, the physical characteristics of the substrate film are modified so as to form better ohmic contacts. For example, it has been observed that nanocrystalline cadmium sulfide films can be altered by anneal and/or swift heavy ion (SHI) irradiation to lower resistivity in the films (for example, see: *Engineering of nanocrystalline cadmium sulfide thin films by using swift heavy ions*, by R. R. Ahire et al., 2007 *J. Phys. D: Appl. Phys.* 40 4850, which is incorporated herein by reference for all purposes). One embodiment of the invention includes exposing the substrate film to at least one of an anneal and irradiation with ions to aid in creation of the ohmic contacts. In one embodiment, the substrate film is irradiated in at least the areas where the contact pins make contact with the substrate film. This may include specific contact point irradiation, that is, coinciding with the contact points only and/or on slight larger areas than the contact points centered on the contact areas. In another implementation of this embodiment, a grid pattern of light, where the illuminated grid on the substrate includes the contact pin areas on the substrate, is used. In another embodiment, the substrate film is irradiated substantially across its surface so that selective irradiation at the contact pin's point of contact is not necessary.

Embodiments of the invention are meant to include combinations of the above methods of forming ohmic contacts, that is, particular materials as part of the contact pins to make ohmic contact at or near the plating potential, applying a break down voltage, exposing the substrate film to high intensity light, and preconditioning the film's physical characteristics toward better ohmic contact.

Embodiments of the invention also include contacting the underlying conductive layer, the layer under the substrate to which ohmic contacts are made, at the periphery, that is, voltage is applied to the periphery of the underlying conductive layer as well as via ohmic contacts through the substrate film.

After the electrodeposition on the substrate film, the contact pins are removed. By virtue of the pins presence during electrodeposition, the pins block electrodeposition on the substrate film at the locations of the contact pins. Therefore when the pins are removed, voids remain in the newly deposited layer.

Figure 7A:
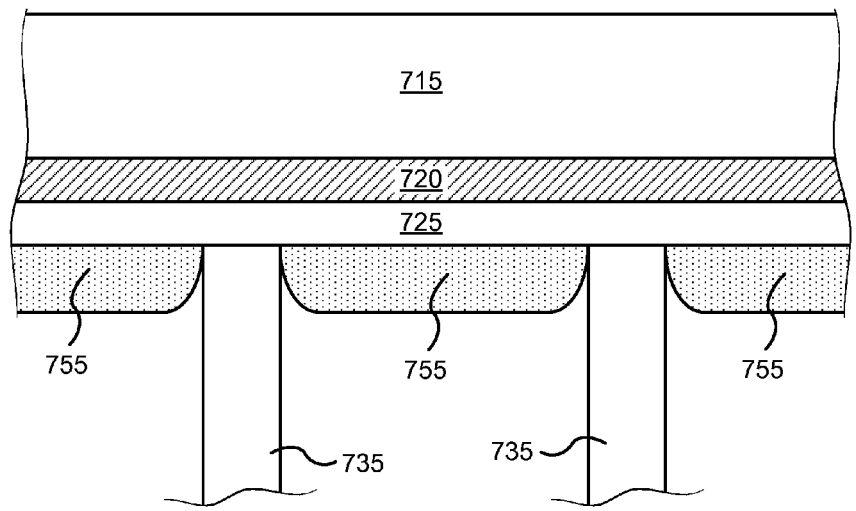
FIGS. 7A and 7B depict cross-sections of a stack formed using methods and apparatus in accord with embodiments of the invention.
Figure 7B:
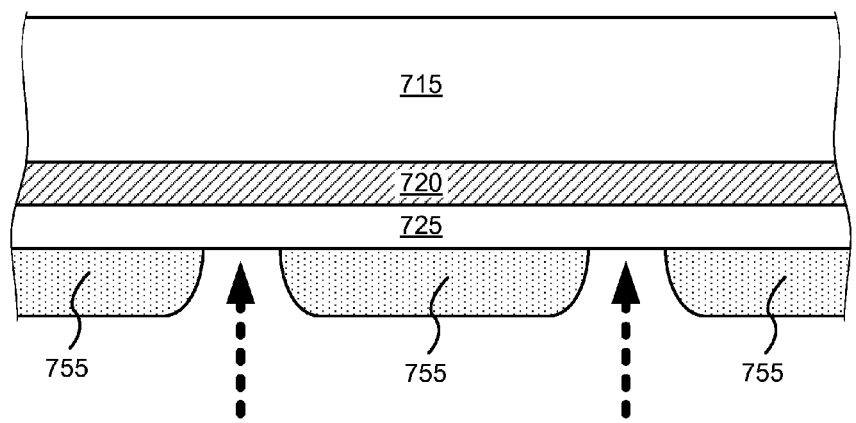

FIG. 7A depicts a cross-section of a portion of a stack, which includes a glass layer, 715, that is coated with a TCO, 720, and on TCO 720 is a CdS layer, 725. Contact pins, 735, are in contact with the CdS substrate film, 725, and a newly deposited CdTe layer, 755, is on top of CdS layer 725. Note that where the contact pins make contact with CdS layer 725, CdTe 755 was blocked from deposition. FIG. 7B shows the result of this deposition, when contact pins 735 are disengaged from substrate film 725. There are voids or holes in newly deposited CdTe layer 755. Thus, the areas where the contact pins make contact with the substrate do not receive any deposition on the substrate and this area is lost for photoelectrical generation. More importantly, these holes must be filled with an insulating material otherwise subsequent deposition of, for example, a back contact layer using, for example, sputtering or electrodeposition of copper, nickel, graphite, tin and/or other metals, alloys and composites would create short circuits in the device, that is, direct electrical communication between the conductive electrode layers of the device stack.

Figure 7C:
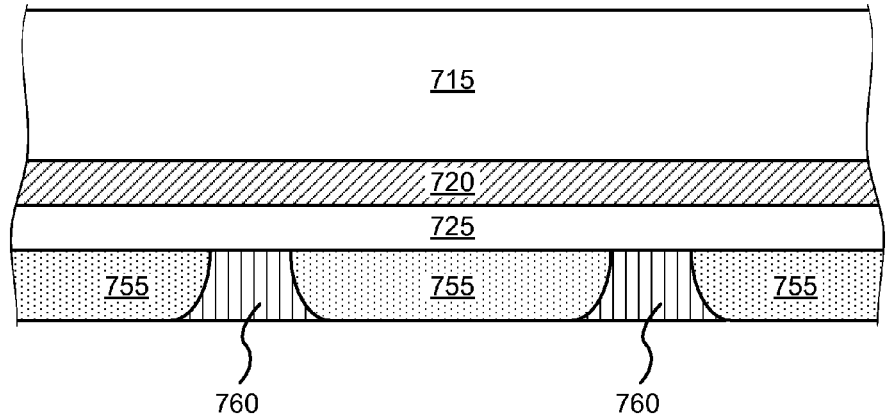
FIGS. 7C and 7D depict cross-sections of stacks formed using methods and apparatus in accord with embodiments of the invention.

FIG. 7C depicts the device stack of FIG. 7B after filling the holes with an insulating material. This insulating material is deposited by at least one of spraying, spin coating, evaporation, drop casting, liquid dispense (for example employing ink jet technology), atomic layer deposition (ALD), chemical deposition and the like. Thus, one embodiment is a method of electrodeposition as described above, further including: (c) disengaging contact between the plurality of contact pins and the substrate film; and (d) filling the holes in the material thus formed with an insulating material. Suitable materials for the insulating material include at least one of a negative photoresist, a positive photoresist, and the like. Photoresists are well suited for this filling operation because adjoining layers, for example depending on their opacity, can be used as masks for selective development of the photoresist in the holes versus on the field region. Using such selective development allows for corresponding selective removal of the resist from the field region and thus leaving plugs of the photoresist in the holes.

Figure 7D:
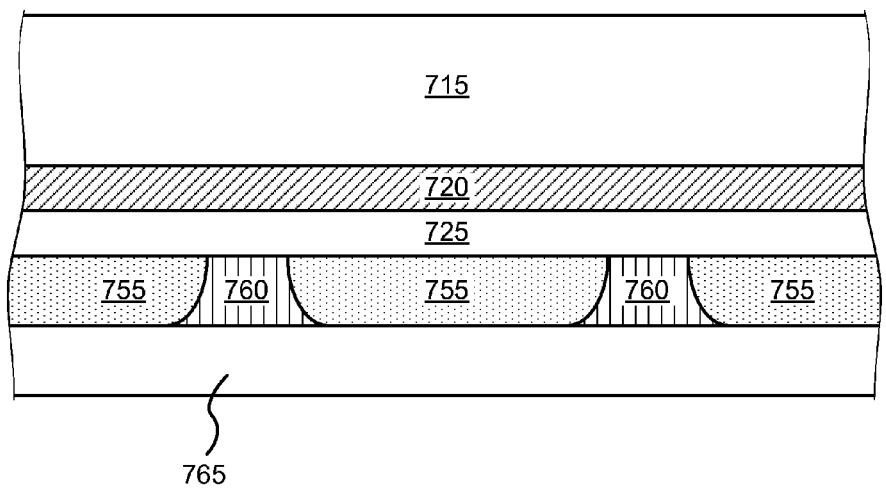

After the holes are filled with the insulating material, subsequent layers can be deposited, as depicted in FIG. 7D, where layer 765, for example a back contact layer, is deposited. In one embodiment, the insulating material is compatible with an anneal of the stack after the holes are filled. In another embodiment, the stack is annealed prior to filling the holes.

Methods of the invention can be used for depositing more than one material layer prior to filling with insulating material. Another embodiment is a method of electrodeposition as described above, further including: (c) electrodepositing a second material onto the (first) material, without first disengaging contact between the plurality of contact pins and the substrate film; (d) withdrawing the plurality of contact pins from the material and the second material; and (e) filling the holes in the (first) material and the second material thus formed with an insulating material. Insulating materials as described above for hole filling are suitable for hole filling in this method as well.

Some methods of the invention obviate the need to fill holes created in a newly electrodeposited layer resulting from electrodeposition followed by disengaging the contact pins from the substrate. One embodiment is an electrodeposition method as described above, where holes are exposed upon disengagement of the contact pins and the substrate, further including arranging the plurality of contact pins so that the areas where each of the plurality of contact pins make contact with the substrate film substantially coincide with one or more laser scribes that will be carried out during formation of one or more photovoltaic cells which include the substrate film. In one example, material (for example CdTe) is removed using laser ablation from certain regions in order to make interconnects and isolation trenches for creation of solar cells in a grid. If the contact probes are placed in a manner such that they are coincident with the areas that would be removed eventually for interconnecting and/or isolating individual cells, then the lack of deposition in the areas where the contact pins leave voids does not result in any additional loss of photoelectrically active area. That is, using this method, there is no need to fill the holes, but rather make them part of, for example, a planned isolation trench or interconnect scheme.

Embodiments described above include scenarios where the contact pins touch a substrate film in order to make ohmic contacts to an underlying conductive layer. It is important to note that transparent conductive oxides, for example, have an inherent sheet resistance, therefore methods of the invention are well suited for laying down, for example, cadmium sulfide layers on a TCO. Even though currently there are more cost effective methods of depositing CdS on a TCO, for example by chemical deposition, these homogeneous nucleation chemical depositions create large waste streams. Electrodeposition methods described herein make less waste, and therefore it is contemplated that due to the true cost of current homogeneous nucleation chemical depositions, methods of the invention may replace them. One embodiment is a method of electrodeposition, including: (a) establishing a plurality of ohmic contacts to a transparent conductive oxide film using a plurality of contact pins, said plurality of contact pins electrically isolated from a counter electrode; and (b) electrodepositing a material from an electrolyte onto the transparent conductive oxide film.

Although the foregoing invention has been described in some detail for purposes of clarity of understanding, it will be apparent that certain changes and modifications may be practiced within the scope of the appended claims. Therefore, the present embodiments are to be considered as illustrative and not restrictive and the invention is not to be limited to the details given herein, but may be modified within the scope and equivalents of the appended claims.

What is claimed is:

1. An apparatus for electrodeposition of a material onto a sample, comprising:
   a support structure including a plurality of contact pins, each contact pin of said plurality of contact pins configured to establish electrical contact with a substrate surface of a semiconductor film of a sample undergoing electrodeposition that is arranged over an underlying conductive layer of the sample undergoing electrodeposition, wherein the contact pins are individually addressable; and
   a controller programmed to individually apply and increase a voltage that is applied to each of the contact pins until a breakdown voltage of the semiconductor film is reached so as to establish an ohmic contact from each contact pin to the underlying conductive layer through the semiconductor film so as to cause negligible resistance from each contact pin, through the semiconductor film, to the underlying conductive layer during electrodeposition of a material onto the substrate surface of the semiconductor film while stopping a further increase in voltage that would otherwise cause a breakdown voltage to be reached in the underlying conductive layer.

2. The apparatus of claim 1, further comprising a movement mechanism for positioning the support structure between the substrate surface and a counter electrode during electrodeposition.

3. The apparatus of claim 2, wherein the support structure comprises a plurality of rods supported by a frame, said plurality of rods arranged to support the plurality of contact pins and supply plating potential to the plurality of contact pins.

4. The apparatus of claim 1, wherein the support structure comprises one or more pin holders, said one or more pin holders arranged to support the plurality of contact pins and supply plating potential to the plurality of contact pins, wherein said pin holders reside outside of the perimeter of the substrate surface during electrodeposition.

5. The apparatus of claim 4, further comprising a positioning mechanism for moving the one or more pin holders into position in order to engage the plurality of contact pins with the substrate surface.

6. The apparatus of claim 1, wherein the plurality of contact pins comprises at least one of a rigid pin, a compliant pin and a spring-type pin.

7. The apparatus of claim 1, wherein the plurality of contact pins are made of a material comprising tungsten that is coated with poly(para-xylylene) except for a tip portion of each pin.

8. The apparatus of claim 7, wherein the tip portion of each pin is further coated with a material comprising at least one of indium, gallium, aluminum, tungsten or zinc.

9. The apparatus of claim 7, further comprising a counter electrode; wherein the counter electrode comprises at least one of ruthenium oxide, iridium oxide, tungsten, or titanium suboxide.

10. The apparatus of claim 1, further comprising a movement mechanism for moving the substrate surface and the support structure with respect to counter electrode so that the substrate surface and counter electrode form two surfaces of a channel for passing a substantially laminar flow of an electrolyte during electrodeposition of the material.

11. The apparatus of claim 1, further comprising a movement mechanism for moving the substrate surface and the support structure with respect to the counter electrode so that the substrate surface and counter electrode form two surfaces of a channel for passing a substantially turbulent flow of an electrolyte during electrodeposition of the material.

12. The apparatus of claim 1, arranged to flow an electrolyte through one or more apertures in the counter electrode, through a plurality of apertures in the support structure and impinge on the substrate surface.

13. The apparatus of claim 1, 2 or 4, arranged to electrodeposit on a curved substrate.

14. The apparatus of claim 1, wherein each of the plurality of contact pins has an associated resistor.

15. The apparatus of claim 14, wherein each of the plurality of contact pins is wired with its associated resistor in series.

16. The apparatus of claim 15, wherein each associated resistor has a value of between about 1 ohm and about 500 ohms.

17. The apparatus of claim 15, wherein each associated resistor has a value of between about 5 ohms and about 100 ohms.

18. The apparatus of claim 15, wherein each associated resistor has a value of between about 10 ohms and about 50 ohms.

19. The apparatus of claim 1, arranged to flow an electrolyte normal to the substrate flowing from the direction of the counter electrode toward the substrate surface and through one or more apertures in the support structure.

20. The apparatus of claim 2, wherein the support structure comprises a circuit board coated with an electrically insulating material comprising at least one of polytetrafluoroethylene (PTFE), perfluoroalkoxy (PFA), polytetrafluoroethylene-perfluoromethylvinylether (MFA), fluorinated ethylene propylene (FEP), ethylene tetrafluoroethylene (ETFE), ethylene chlorotrifluoroethylene (ECTFE), polyvinylidene fluoride (PVDF), tetrafluoroethylene hexafluoropropylene vinylidene fluoride (THV), polyetheretherketone (PEEK), polyetherimide (PEI) and poly(p-xylylene) (Parylene).

21. The apparatus of claim 1, further comprising a positioning mechanism for positioning the contact pins at a plurality of positions on the substrate surface so as to block deposition of a film at such positions during electrodeposition.

22. The apparatus of claim 1, further comprising a positioning mechanism for positioning the contact pins at a plurality of positions on the substrate surface so as to cause voids to be formed at such positions in the film during electrodeposition.

23. The apparatus of claim 1, further comprising a positioning mechanism for fixably positioning the contact pins on the substrate surface during electrodeposition.

24. The apparatus of claim 1, wherein the contact pins have a spacing for facilitating control of a potential drop across the semiconductor film and/or underlying conductive layer.

25. The apparatus of claim 1, further comprising a control circuit associated with the contact pins that is programmed to apply different potentials to different contact pins to thereby establish a plurality of electrical flows from the contact pins through the semiconductor film to the underlying conductive layer during electrodeposition of the material, wherein the controller is programmed to cause the control circuit to apply different potentials to different contact pins to thereby establish a plurality of electrical flows from the contact pins through the semiconductor film to the underlying conductive layer.

26. An apparatus for electrodeposition of a material onto a sample, comprising:
- a support structure including a plurality of compliant contact pins, each contact pin of said plurality of compliant contact pins arranged to establish electrical contact with a substrate surface of a semiconductor film of a sample undergoing electrodeposition that is arranged over an underlying conductive layer of the sample undergoing electrodeposition; wherein the support structure comprises one or more pin holders, said one or more pin holders arranged to support the plurality of compliant contact pins, wherein said pin holders reside outside of the perimeter of the substrate surface during electrodeposition, and wherein the compliant contact pins are individually addressable;
- a control circuit coupled with the compliant contact pins and the control circuit being arranged to individually apply a breakdown voltage to each of the compliant contact pins; and
- a controller programmed to cause the control circuit to individually increase a voltage that is applied to each of the compliant contact pins until a breakdown voltage of the semiconductor film is reached so as to establish an ohmic contact from each compliant contact pin to the underlying conductive layer through the semiconductor film so as to cause an electrical flow from each compliant contact pin, through the semiconductor film, to the underlying conductive layer during electrodeposition of a material onto the substrate surface of the semiconductor film while stopping a further increase in voltage that would otherwise cause a breakdown voltage to be reached in the underlying conductive layer.

27. The apparatus of claim 26, further comprising a positioning mechanism for moving the one or more pin holders into position in order to engage the plurality of compliant contact pins with the substrate surface.

28. The apparatus of claim 26, wherein the plurality of compliant contact pins are made of a material comprising tungsten that is coated with poly(para-xylylene) except for a tip portion of each pin.

29. The apparatus of claim 28, wherein the tip portion of each of the plurality of compliant contact pins is further coated with a material comprising at least one of indium, gallium, aluminum, tungsten, or zinc.

30. The apparatus of claim 28, wherein the counter electrode comprises at least one of ruthenium oxide, iridium oxide, or titanium suboxide.

31. The apparatus of claim 26, wherein the plurality of compliant contact pins are arranged to be placed across a photoelectrically active area of a solar cell of the sample.

32. The apparatus of claim 31, wherein each pin of the plurality of compliant contact pins has an average diameter of between about 100 microns and about 500 microns.

33. The apparatus of claim 26, further comprising a movement mechanism for moving the substrate surface and the support structure with respect to the counter electrode so that the substrate surface and counter electrode form two surfaces of a substantially laminar flow of an electrolyte during electrodeposition of the material.

34. The apparatus of claim 26, further comprising a movement mechanism for moving the substrate surface and the support structure with respect to the counter electrode so that the substrate surface and counter electrode form two surfaces of a substantially turbulent flow of an electrolyte during electrodeposition of the material.

35. The apparatus of claim 26, arranged to flow an electrolyte through one or more apertures in the counter electrode and impinge on the substrate surface.

36. The apparatus of claim 26, arranged to electrodeposit on a curved substrate.

37. The apparatus of claim 26, wherein each of the plurality of compliant contact pins has an associated resistor.

38. The apparatus of claim 37, wherein each of the plurality of compliant contact pins is wired with its associated resistor in series.

39. The apparatus of claim 38, wherein each associated resistor has a value of between about 1 ohm and about 500 ohms.

40. The apparatus of claim 38, wherein each associated resistor has a value of between about 5 ohms and about 100 ohms.

41. The apparatus of claim 38, wherein each associated resistor has a value of between about 10 ohms and about 50 ohms.

42. The apparatus of claim 26, further comprising a movement mechanism for moving the support structure and the substrate surface towards each other so that the compliant contact pins are fixably positioned at a plurality of positions on the substrate surface and cause voids to be formed in a film at such positions during electrodeposition.

* * * * *